US012796476B2

(12) United States Patent
Guo

(10) Patent No.: US 12,796,476 B2
(45) Date of Patent: Nov. 10, 2026

(54) ELECTRONIC DEVICE AND CHIP PACKAGING METHOD

(71) Applicant: Honor Device Co., Ltd., Shenzhen (CN)

(72) Inventor: Xueping Guo, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 768 days.

(21) Appl. No.: 17/924,814

(22) PCT Filed: May 7, 2022

(86) PCT No.: PCT/CN2022/091534
§ 371 (c)(1),
(2) Date: Nov. 11, 2022

(87) PCT Pub. No.: WO2023/024573
PCT Pub. Date: Mar. 2, 2023

(65) Prior Publication Data

US 2024/0136304 A1 Apr. 25, 2024
US 2024/0234334 A9 Jul. 11, 2024

(30) Foreign Application Priority Data

Aug. 23, 2021 (CN) ......................... 202110968469.4

(51) Int. Cl.
*H10W 42/20* (2026.01)
*H10W 70/05* (2026.01)
(Continued)

(52) U.S. Cl.
CPC ......... *H10W 42/20* (2026.01); *H10W 70/093* (2026.01); *H10W 74/01* (2026.01); *H10W 90/701* (2026.01)

(58) Field of Classification Search
CPC ... H01L 23/552; H01L 21/4853; H01L 21/56; H01L 23/49811; H01L 25/16;
(Continued)

(56) References Cited

U.S. PATENT DOCUMENTS

2004/0070087 A1 4/2004 Wang et al.
2014/0048913 A1 2/2014 Park et al.
(Continued)

FOREIGN PATENT DOCUMENTS

CN 107768349 A 3/2018
CN 107978580 A 5/2018
(Continued)

*Primary Examiner* — Jacob Y Choi
*Assistant Examiner* — Neil R Prasad
(74) *Attorney, Agent, or Firm* — Conley Rose, P.C.

(57) ABSTRACT

An electronic device includes a housing. A substrate is arranged in the housing. A first crystal device and an adapter board are arranged in parallel on a side surface of the substrate. A first ground pad is arranged on a surface of the adapter board facing the substrate, and the adapter board is electrically connected to the substrate by the first ground pad, so that the adapter board is grounded. A first part of a first plastic packaging layer is arranged on a surface of the first crystal device, and a second part of the first plastic packaging layer is arranged between the adapter board and the substrate. The first part and the second part are integrally formed. A first shielding metal covers a surface of the first part and is electrically connected to the first ground pad, so that the first shielding metal is grounded.

11 Claims, 15 Drawing Sheets

(51) Int. Cl.
*H10W 74/01* (2026.01)
*H10W 90/00* (2026.01)

(58) Field of Classification Search
CPC ........... H01L 23/3128; H01L 23/49816; H01L 23/5383; H01L 23/5386
See application file for complete search history.

(56) References Cited

U.S. PATENT DOCUMENTS

| | | | | |
|---|---|---|---|---|
| 2015/0325529 | A1 | 11/2015 | Choi | |
| 2017/0179039 | A1* | 6/2017 | Lee | H01L 21/4853 |
| 2017/0179041 | A1 | 6/2017 | Dias et al. | |
| 2018/0019216 | A1 | 1/2018 | Hassan et al. | |
| 2018/0048344 | A1 | 2/2018 | Kazanchian | |
| 2018/0053732 | A1* | 2/2018 | Baek | H01L 23/5389 |
| 2018/0114758 | A1* | 4/2018 | Yao | H01L 21/4853 |
| 2018/0323128 | A1 | 11/2018 | Dias et al. | |
| 2019/0051611 | A1 | 2/2019 | Kim et al. | |
| 2020/0359124 | A1 | 11/2020 | Hankey et al. | |
| 2020/0395262 | A1* | 12/2020 | Nomura | H01L 23/552 |
| 2022/0093522 | A1* | 3/2022 | Shanmugam | H01L 21/561 |
| 2022/0223541 | A1 | 7/2022 | Lin et al. | |

FOREIGN PATENT DOCUMENTS

| | | | |
|---|---|---|---|
| CN | 111933621 | A | 11/2020 |
| CN | 112242360 | A | 1/2021 |
| CN | 112563249 | A | 3/2021 |
| CN | 113140538 | A | 7/2021 |
| JP | 2001267710 | A | 9/2001 |
| JP | 2018511981 | A | 4/2018 |
| WO | 2019181761 | A1 | 9/2019 |

* cited by examiner

ELECTRONIC DEVICE AND CHIP PACKAGING METHOD

CROSS-REFERENCE TO RELATED APPLICATIONS

This application is a U.S. National Stage of International Application No. PCT/CN2022/091534 filed on May 7, 2022, which claims priority to Chinese Patent Application No. 202110968469.4, filed with the Chinese Patent Office on Aug. 23, 2021, both of which are incorporated herein by reference in their entireties.

TECHNICAL FIELD

This application relates to the field of chip packaging, and in particular, to an electronic device and a chip packaging method.

BACKGROUND

Electronic devices have always been developed toward miniaturization. At present, smart watches, smart bracelets, wireless headsets, and the like that have relatively small volumes have appeared. As the volume of the electronic device is gradually reduced and the functions are gradually diversified, the number of components for realizing the functions is also gradually increased, which also leads to a gradual increase in the density of the components of the electronic device. Therefore, higher requirements are imposed on the packaging process of the electronic device.

For an electronic device with Bluetooth, Wi-Fi, or other data transmission functions, for example, referring to FIG. 1, the wireless headset and the mobile phone are paired and connected by using the Bluetooth function. In order to realize Bluetooth, Wi-Fi, or other data transmission, the electronic device is provided with an antenna, and the antenna and other components are jointly packaged in the same packaging structure. However, in the working process of the electronic device, the antenna generates electromagnetic waves, and in a small space, the antenna causes electromagnetic wave interference to other components, which may reduce the working performance of other components. In such a working state for a long time, the device is prone to damage, and the electronic device may be damaged.

SUMMARY

Embodiments of this application provide an electronic device and a chip packaging method, so as to ensure the shielding effect between devices and avoid mutual impact between the devices.

In order to achieve the above objective, the embodiments of this application provide the following technical solutions.

In a first aspect, an embodiment of this application provides an electronic device, including: a housing; a substrate arranged in the housing: a first crystal device and an adapter board arranged in parallel on a side surface of the substrate, where the adapter board includes a first ground pad, the first ground pad is arranged on a surface of the adapter board facing the substrate, and the adapter board is electrically connected to the substrate by the first ground pad, so that the adapter board is grounded: a first plastic packaging layer, where a first part of the first plastic packaging layer is arranged on a surface of the first crystal device, a second part of the first plastic packaging layer is arranged between the adapter board and the substrate, and the first part and the second part are integrally formed; and a first shielding metal covering a surface of the first part and electrically connected to the first ground pad, so that the first shielding metal is grounded.

It can be learned from the above technical solutions that the first part is arranged outside the first crystal device, and a closed Faraday cage may be formed by the grounding of the first part to separate the first crystal device from the adapter board, so as to realize shielding between the first crystal device and the adapter board. During realizing of shielding, there is no need to expand the layout space, and the shielding effect is significant.

In an implementation, the adapter board further includes an interconnect via, one end of the interconnect via is connected to the first ground pad, and an other end of the interconnect via extends through a surface of the adapter board facing away from the substrate. The first shielding metal extends from the surface of the first part to the surface of the adapter board facing away from the substrate, and is connected to the interconnect via, so that the first shielding metal is connected to the first ground pad through the interconnect via. In this way, the first shielding metal may be grounded by covering the interconnect via, so as to realize the grounding of the first shielding metal without needing to add components. Therefore, the process is simple, and the integration is high.

In an implementation, the adapter board further includes an interconnect via and a second ground pad. The second ground pad is arranged on a surface of the adapter board facing away from the substrate, and two ends of the interconnect via are respectively connected to the first ground pad and the second ground pad. The first shielding metal extends from the surface of the first part to the surface of the adapter board facing away from the substrate, and is connected to the second ground pad, so that the first shielding metal is connected to the first ground pad by the second ground pad and the interconnect via. In this way, the first shielding metal can be grounded by the second ground pad, the interconnect via, and the first ground pad.

In an implementation, a second shielding metal includes a first shielding segment and a second shielding segment. The first shielding segment is arranged on a side surface of the adapter board facing the first crystal device, and an end of the first shielding segment away from the substrate is connected to the first shielding metal. The second shielding segment is arranged on the surface of the adapter board facing the substrate, one end of the second shielding segment is connected to the first shielding segment, and an other end of the second shielding segment is connected to the first ground pad. In this way, the first shielding metal can be connected to the first ground pad by the second shielding segment and the first shielding segment, thereby realizing the grounding.

In an implementation, the second shielding metal further includes a third shielding segment. The third shielding segment is arranged on the surface of the adapter board facing away from the substrate, one end of the third shielding segment is connected to the first shielding segment, an other end of the third shielding segment extends toward the second ground pad by a certain distance, and the third shielding segment is connected to the first shielding metal.

In an implementation, a third ground pad is arranged at a position where the first shielding metal comes into contact with the substrate. The first shielding metal is connected to the third ground pad, so that the first shielding metal is grounded. In this way, an end of the first shielding metal away from the adapter board can be grounded.

In an implementation, the adapter board is distributed on an edge of the substrate.

In an implementation, the electronic device further includes: a second crystal device, arranged on an other surface of the substrate; a second plastic packaging layer, arranged on a surface of the second crystal device; a third shielding metal, covering a surface of the second plastic packaging layer and a side surface of the substrate; and a ground metal layer, arranged inside the substrate, extending from the inside of the substrate to the side surface of the substrate, and connected to the third shielding metal. In this way, double-sided packaging of the substrate can be realized. In addition, the first crystal device on one side surface of the substrate and the adapter board can be shielded from each other, and the second crystal device on an other side of the substrate can also be separated from the outside, thereby avoiding leakage of electromagnetic signals.

In an implementation, the third shielding metal further covers a side surface of the second part facing away from the first crystal device, and further covers a side surface of the adapter board facing away from the first crystal device.

In an implementation, the first crystal device includes one or more of a NOR flash memory, a MOS transistor, an SoC chip, a decoding circuit, a charging chip, an RLC device, a crystal, a Bluetooth chip, a radio frequency chip, a Wi-Fi chip, an NFC chip, or a sensor.

In an implementation, the second crystal device includes one or more of a NOR flash memory, a MOS transistor, an SoC chip, a decoding circuit, a charging chip, an RLC device, a crystal, a Bluetooth chip, a radio frequency chip, a Wi-Fi chip, an NFC chip, or a sensor.

In an implementation, the first shielding metal, the second shielding metal, and the third shielding metal are formed by spraying or sputtering.

In a second aspect, an embodiment of this application further provides a chip packaging method, including: arranging a substrate inside a housing; bonding or soldering a first crystal device to a side surface of the substrate, manufacturing a first ground pad on an adapter board, and soldering the adapter board to the side surface of the substrate by using the first ground pad, where the first ground pad is arranged on a surface of the adapter board facing the substrate, the first crystal device and the adapter board are arranged in parallel, and the adapter board is electrically connected to the substrate by the first ground pad, so that the adapter board is grounded: coating a molding compound on a surface of the first crystal device to form a first part; coating a molding compound between the adapter board and the substrate to form a second part, where the first part and the second part form a first plastic packaging layer, and the first part and the second part are integrally formed; and covering a surface of the first part with a metal after the first part is cured, to form a first shielding metal, where the first shielding metal is electrically connected to the first ground pad, so that the first shielding metal is grounded.

It can be learned from the above technical solutions that the first part is arranged outside the first crystal device, and a closed Faraday cage may be formed by the grounding of the first part to separate the first crystal device from the adapter board, so as to realize shielding between the first crystal device and the adapter board. During realizing of shielding, there is no need to expand the layout space, and the shielding effect is significant.

In an implementation, an interconnect via is manufactured on the adapter board, one end of the interconnect via, is connected to the first ground pad, and an other end of the interconnect via extends through a surface of the adapter board facing away from the substrate. The first shielding metal extends from the surface of the first part to the surface of the adapter board facing away from the substrate, and is connected to the interconnect via, so that the first shielding metal is connected to the first ground pad through the interconnect via. In this way, the first shielding metal may be grounded by covering the interconnect via, so as to realize the grounding of the first shielding metal without needing to add components. Therefore, the process is simple, and the integration is high.

In an implementation, an interconnect via and a second ground pad are manufactured on the adapter board. The second ground pad is arranged on a surface of the adapter board facing away from the substrate, and two ends of the interconnect via are respectively connected to the first ground pad and the second ground pad. The first shielding metal extends from the surface of the first part to the surface of the adapter board facing away from the substrate, and is connected to the second ground pad, so that the first shielding metal is connected to the first ground pad through the second ground pad and the interconnect via. In this way, the first shielding metal can be grounded by the second ground pad, the interconnect via, and the first ground pad.

In an implementation, a side surface of the adapter board facing the first crystal device is covered with a metal to form a first shielding segment. An end of the first shielding segment away from the substrate is connected to the first shielding metal, A surface of the adapter board facing the substrate is covered with a metal to form a second shielding segment. One end of the second shielding segment is connected to the first shielding segment, and an other end of the second shielding segment is connected to the first ground pad. The first shielding segment and the second shielding segment form a second shielding metal. In this way, the first shielding metal can be connected to the first ground pad by the second shielding segment and the first shielding segment, thereby realizing the grounding.

In an implementation, the surface of the adapter board facing away from the substrate is covered with a metal to form a third shielding segment. One end of the third shielding segment is connected to the first shielding segment, an other end of the third shielding segment extends toward the second ground pad by a certain distance, and the third shielding segment is connected to the first shielding metal. The first shielding segment, the second shielding segment, and the third shielding segment form a second shielding metal.

In an implementation, a third ground pad is manufactured at a position where the first shielding metal comes into contact with the substrate. The first shielding metal is connected to the third ground pad, so that the first shielding metal is grounded. In this way, an end of the first shielding metal away from the adapter board can be grounded.

In an implementation, the adapter board is soldered to the side surface of the substrate by using the first ground pad, and the adapter board is distributed on an edge of the substrate.

In an implementation, a second crystal device is soldered or bonded to an other surface of the substrate. A molding compound is coated on a surface of the second crystal device to form a second plastic packaging layer. After the second plastic packaging layer is cured, a surface of the second plastic packaging layer and the side surface of the substrate are covered with a metal, to form a third shielding metal. A ground metal layer is manufactured inside the substrate, extends from the inside of the substrate to the side surface of the substrate, and is connected to the third shielding metal. In this way, double-sided packaging of the substrate can be realized. In addition, the first crystal device on one side surface of the substrate and the adapter board can be shielded from each other, and the second crystal device on an other side of the substrate can also be separated from the outside, thereby avoiding leakage of electromagnetic signals.

In an implementation, the side surface of the second part facing away from the first crystal device and the side surface of the adapter board facing away from the first crystal device are covered with a metal to form a third shielding metal.

In an implementation, the first crystal device includes one or more of a NOR flash memory, a MOS transistor, an SoC chip, a decoding circuit, a charging chip, an RLC device, a crystal, a Bluetooth chip, a radio frequency chip, a Wi-Fi chip, an NFC chip, or a sensor.

In an implementation, the second crystal device includes one or more of a NOR flash memory, a MOS transistor, an SoC chip, a decoding circuit, a charging chip, an RLC device, a crystal, a Bluetooth chip, a radio frequency chip, a Wi-Fi chip, an NFC chip, or a sensor.

In an implementation, the first shielding metal, the second shielding metal, and the third shielding metal are formed by spraying or sputtering.

DESCRIPTION OF EMBODIMENTS

For ease of understanding the technical solutions of the embodiments of this application, some technical terms in the technical field to which the embodiments of this application belong are briefly introduced first before the specific implementations of the embodiments of this application are described.

Reflow soldering (reflow soldering) is to heat air or nitrogen to a high enough temperature and blow the heated air or nitrogen to a circuit board to which an element has been attached, so that the solder on both sides of the element is melted and bonded to the circuit board.

A true wireless (true wireless stereo, TWS) headset, that is, a true wireless stereo headset, may be connected to a device such as a mobile phone by Bluetooth. The TWS headset can process a Bluetooth signal in such a way that left and right channels are wirelessly separated, and left and right headsets can be used separately, which has the characteristics such as low latency, fast connection by Bluetooth, a fast transmission speed, low energy consumption, and the like.

Electronic devices have always been developed toward miniaturization. At present, smart watches, smart bracelets, wireless headsets, and the like that have relatively small volumes have appeared. As the volume of the electronic device is gradually reduced and the functions are gradually diversified, the number of components for realizing the functions is also gradually increased, which also leads to a gradual increase in the density of the components of the electronic device. Therefore, higher requirements are imposed on the packaging process of the electronic device.

Figure 1:
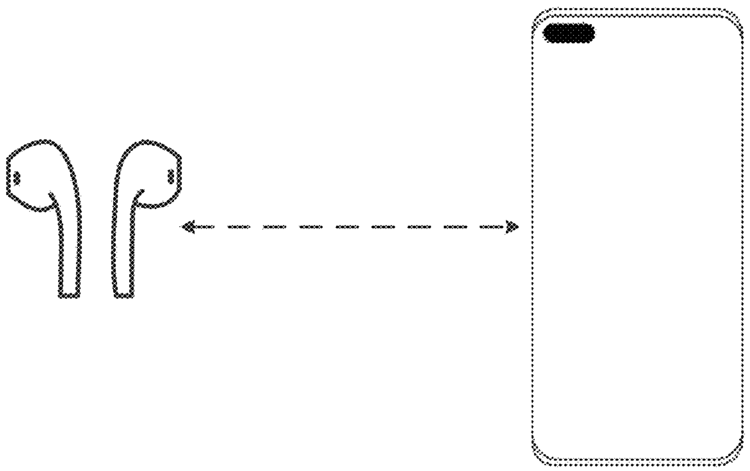
FIG. 1 is a schematic diagram of connection between a wireless headset and a mobile phone.

For an electronic device with Bluetooth, Wi-Fi, or other data transmission functions, for example, referring to FIG. 1, the wireless headset and the mobile phone are paired and connected by using the Bluetooth function. In order to realize Bluetooth, Wi-Fi, or other data transmission, the electronic device is provided with an antenna, and the antenna and other components are jointly packaged in the same packaging structure. However, in the working process of the electronic device, the antenna generates electromagnetic waves, and in a small space, the antenna causes electromagnetic wave interference to other components, which may reduce the working performance of other components. In such a working state for a long time, the device is prone to damage, and the electronic device may be damaged.

Figure 2:
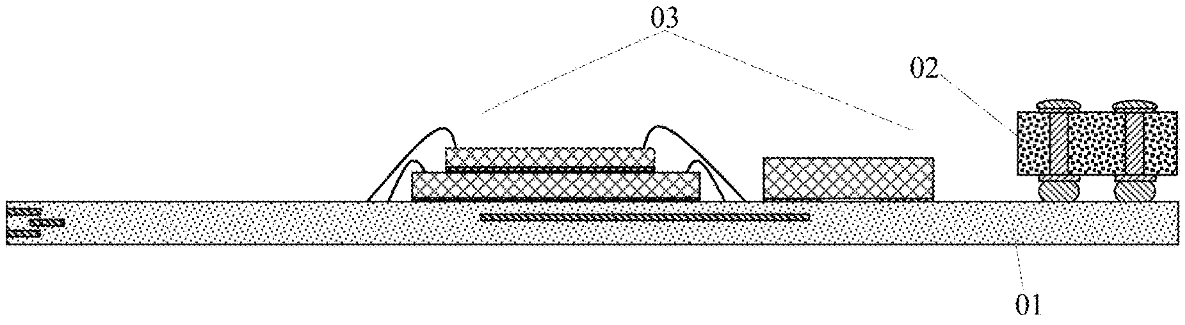
FIG. 2 (PRIOR ART)
FIG. 2 is a schematic diagram of a current electronic device.

Referring to FIG. 2, FIG. 2 is a schematic diagram of a current electronic device.

As shown in FIG. 2, the electronic device may include a substrate 01, an adapter board 02 soldered to a side of the substrate 01, and a first component 03. The adapter board 02 is a circuit board that can transmit signals and generate electromagnetic waves during operation. Since the adapter board 02 and the first component 03 are arranged in parallel on the side of the substrate 01, the electromagnetic waves generated by the adapter board 02 during operation directly cause electromagnetic wave interference to the first component 03.

In order to resolve the above problem, an embodiment of this application provides an electronic device.

Figure 3:
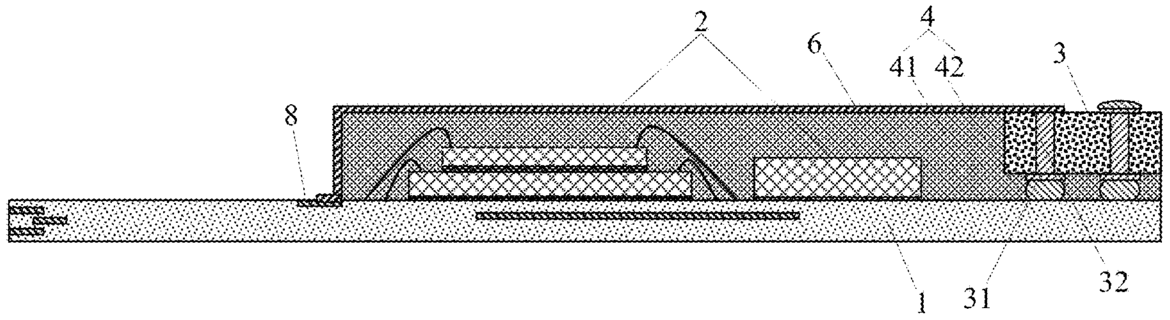
FIG. 3 is a first schematic structural diagram of an electronic device according to an embodiment of this application.
Figure 23:
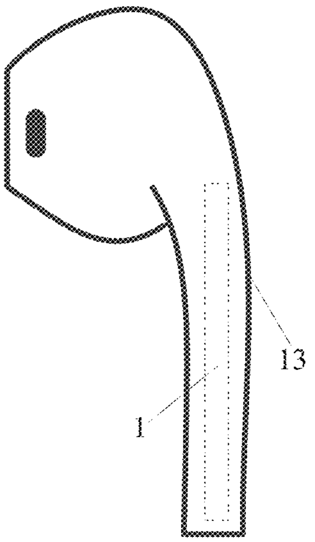
FIG. 23 is a schematic structural diagram of a housing of an electronic device according to an embodiment of this application.

Referring to FIG. 3, FIG. 3 is a first schematic structural diagram of an electronic device according to an embodiment of this application. Referring to FIG. 23, FIG. 23 is a schematic structural diagram of a housing of an electronic device according to an embodiment of this application. It may be seen from FIG. 3 and FIG. 23 that the electronic device may include a housing 13, a substrate 1, a first crystal device 2, an adapter board 3, a first plastic packaging layer 4, and a first shielding metal 6. The first crystal device 2 and the adapter board 3 are arranged in parallel on a side surface of the substrate 1.

During specific implementation, the substrate 1 is arranged inside the housing 13. A ground layer is arranged inside the substrate 1 so that a component electrically connected to the substrate 1 can be grounded. The first crystal device 2 may be fixed to the substrate 1 by soldering or bonding.

The adapter board 3 may include a first ground pad 31. The first ground pad 31 is arranged on a surface of the adapter board 3 facing the substrate 1, and the adapter board 3 may be electrically connected to the substrate 1 by the first ground pad 31, so that the adapter board 3 is grounded.

In some implementations, a manner in which the adapter board 3 is packaged on the substrate 1 may be ball grid array (ball grid array, BOA) packaging. A BGA solder ball may be formed between the first ground pad 31 and the substrate 1, and the first ground pad 31 provides a position for the BGA solder ball to be attached. In this way, the adapter board 3 can be packaged on the substrate 1, and is electrically connected to the substrate 1 by the first ground pad 31 and the BGA solder ball.

The first plastic packaging layer 4 may include a first part 41 and a second part 42. The first part 41 may be arranged on a surface of the first crystal device 2, and the second part 42 may be arranged between the adapter board 3 and the substrate 1. The first part 41 can be wrapped around the first crystal device 2, and the second part 42 can be filled between the adapter board 3 and the substrate 1, so as to achieve the functions of insulation, heat dissipation, and dust prevention. In addition, the first crystal device 2 and the adapter board 3 can be prevented from being displaced or damaged when subjected to an external force.

The first part 41 and the second part 42 may be formed of a molding compound and shaped by a molding jig.

It should be understood that the division of the first part 41 and the second part 42 is only for the convenience of description, rather than division in a physical sense, that is, the first part 41 and the second part 42 are integrally formed.

The first shielding metal 6 may cover the surface of the first part 41, and the first shielding metal 6 is electrically connected to the first ground pad 31, so that the first shielding metal 6 is grounded. The first shielding metal 6 may, be manufactured and formed on the surface of the first part 41 by spraying or sputtering, and a thickness of the first shielding metal 6 may be designed according to the actual situation.

It can be seen from FIG. 3 that after the first shielding metal 6 is grounded by the first ground pad 31, a closed space may be formed. This space can isolate the first crystal device 2, so that the first crystal device 2 can be shielded from the adapter board 3, and the first crystal device 2 and the adapter board 3 will not interfere with each other.

In an implementation, the electronic device provided in the embodiment of this application may further be provided with a third ground pad 8. The third ground pad 8 is arranged at a position where the first shielding metal 6 comes into contact with the substrate 1. The first shielding metal 6 is connected to the third ground pad 8, so that the first shielding metal 6 is grounded by the substrate 1. The third ground pad 8 may be manufactured on the substrate 1 in advance.

FIG. 3 further specifically shows a grounding manner of the first shielding metal 6. It may be seen from FIG. 3 that the adapter board 3 includes an interconnect via 32. One end of the interconnect via 32 is connected to the first ground pad 31, and an other end of the interconnect via extends through a surface of the adapter board 3 facing away from the substrate 1. The first shielding metal 6 extends from the surface of the first part 41 to the surface of the adapter board 3 facing away from the substrate 1, and is connected to the interconnect via. 32, so that the first shielding metal 6 is connected to the first ground pad 31 through the interconnect via 32.

Figure 4:
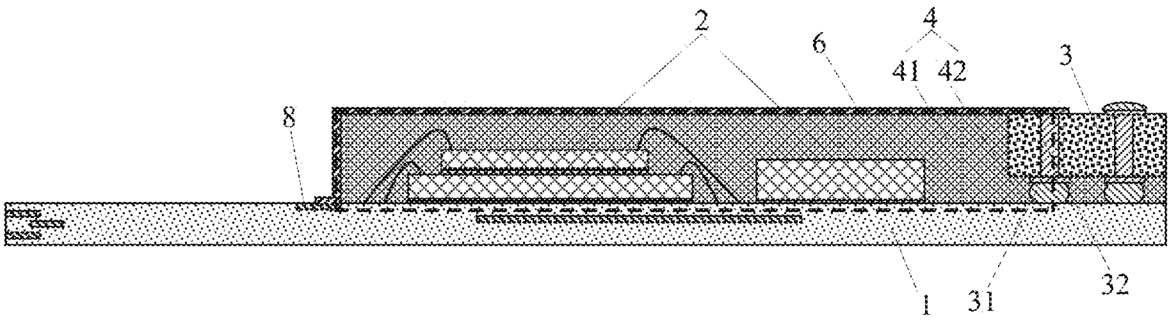
FIG. 4 is a schematic diagram of a first Faraday cage of an electronic device according to an embodiment of this application.

The interconnect via 32 can play the role of electrical connection. After the first shielding metal 6 covers one side surface of the interconnect via 32, the first shielding metal may be electrically connected to the first ground pad 31 on an other side surface of the interconnect via 32 through the interconnect via 32. In this wax, the substrate ground layer, the first shielding metal 6, the interconnect via 32, the first ground pad 31, and the BGA solder ball form a quasi-closed space, that is, a "Faraday cage" is formed. Referring to FIG. 4, FIG. 4 is a schematic diagram of a first Faraday cage of an electronic device according to an embodiment of this application. The part shown by the dashed box in FIG. 4 may be regarded as a "Faraday cage". The "Faraday cage" can play the role of shielding, which can ensure that the first crystal device 2 inside the Faraday cage is protected from the electromagnetic interference of the adapter board 3, and can also protect the first crystal device 2 from the electromagnetic interference of the external environment. In addition, the adapter board 3 outside the "Faraday cage" can be protected from interference by the first crystal device 2.

A pore size of the interconnect via 32 may be designed according to actual requirements, which is not specifically limited in this application.

During manufacturing of the first shielding metal 6 on the surface of the adapter board 3 facing away from the substrate 1, since the first shielding metal 6 only covers the interconnect via 32, in order to avoid the impact of the spraying or sputtering process on other components of the adapter board 3, a position on the adapter board 3 except the interconnect via. 32 may be covered with a shielding film to play the role of shielding.

Figure 5:
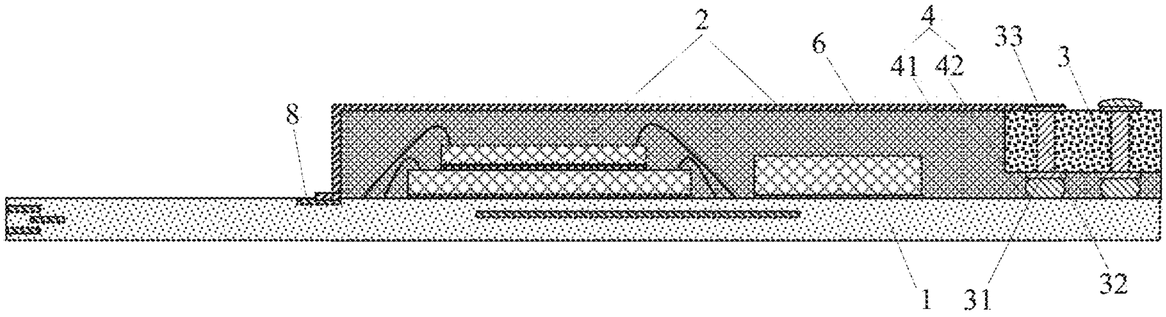
FIG. 5 is a second schematic structural diagram of an electronic device according to an embodiment of this application.

Referring to FIG. 5, FIG. 5 is a second schematic structural diagram of an electronic device according to an embodiment of this application. It may be seen from FIG. 5 that the grounding manner of the first shielding metal 6 may further be realized by the following components.

The adapter board 3 further includes a second ground pad 33. The second ground pad 33 is arranged on a surface of the adapter board 3 facing away from the substrate 1, and two ends of the interconnect via 32 are respectively connected to the first ground pad 31 and the second ground pad 33. The first shielding metal 6 extends from the surface of the first part 41 to the surface of the adapter board facing away from the substrate 1, and is connected to the second ground pad 33, so that the first shielding metal 6 is connected to the first ground pad 31 by the second ground pad 33 and the interconnect Via 32.

Figure 6:
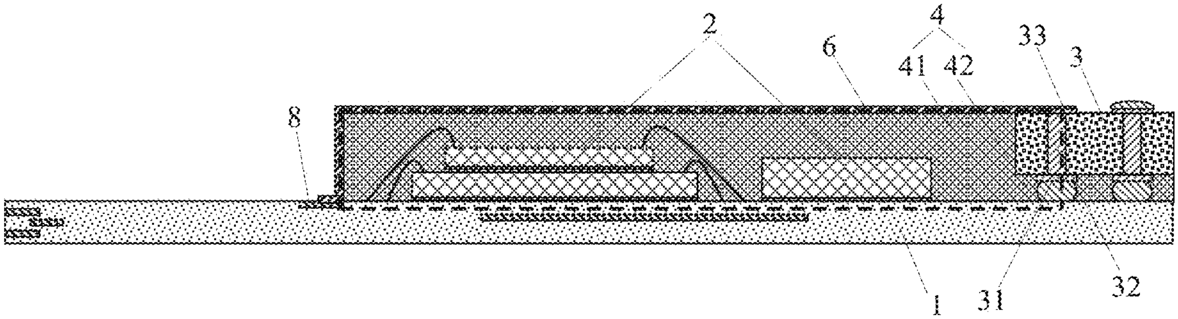
FIG. 6 is a schematic diagram of a second Faraday cage of an electronic device according to an embodiment of this application.

In this way, the substrate ground layer, the first shielding metal 6, the second ground pad 33, the interconnect via 32, the first ground pad 31, and the BGA solder ball form a quasi-closed space, that is, a "Faraday cage". Referring to FIG. 6. FIG. 6 is a schematic diagram of a second Faraday cage of an electronic device according to an embodiment of this application. The part shown by the dashed box in FIG. 6 may be regarded as a "Faraday cage". The effect that the "Faraday cage" can achieve has been described in the previous description, and details will not be described herein again.

During manufacturing of the first shielding metal 6 on a surface of the adapter board 3 facing away from the substrate 1, since the first shielding metal 6 only covers the second ground pad 33, in order to avoid the impact of the spraying or sputtering process on other components of the adapter board 3, a position on the adapter board 3 except the second ground pad 33 may be covered with a shielding film to play the role of shielding.

Figure 7:
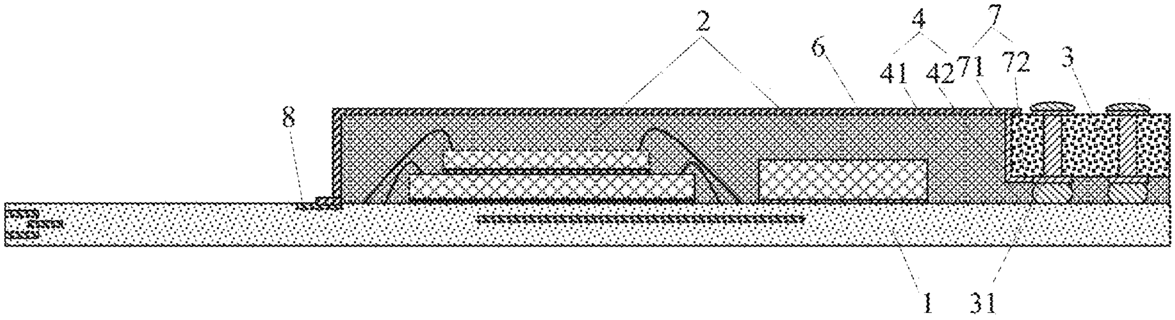
FIG. 7 is a third schematic structural diagram of an electronic device according to an embodiment of this application.

Referring to FIG. 7, FIG. 7 is a third schematic structural diagram of an electronic device according to an embodiment of this application. In order to realize the grounding of the first shielding metal 6, a second shielding metal 7 may further be arranged outside the adapter board 3 by spraying or sputtering.

The second shielding metal 7 may include a first shielding segment 71 and a second shielding segment 72. The first shielding segment 71 is arranged on a side surface of the adapter board 3 facing the first crystal device 2, and an end of the first shielding segment 71 away from the substrate 1 is connected to the first shielding metal 6. One end of the second shielding segment 72 is connected to the first shielding segment 71, and an other end of the second shielding segment is connected to the first ground pad 31.

The first shielding metal 6 may be connected to the first ground pad 31 by the first shielding segment 71 and the second shielding segment 72 after being connected to the first shielding segment 71, thereby realizing the grounding.

Figure 8:
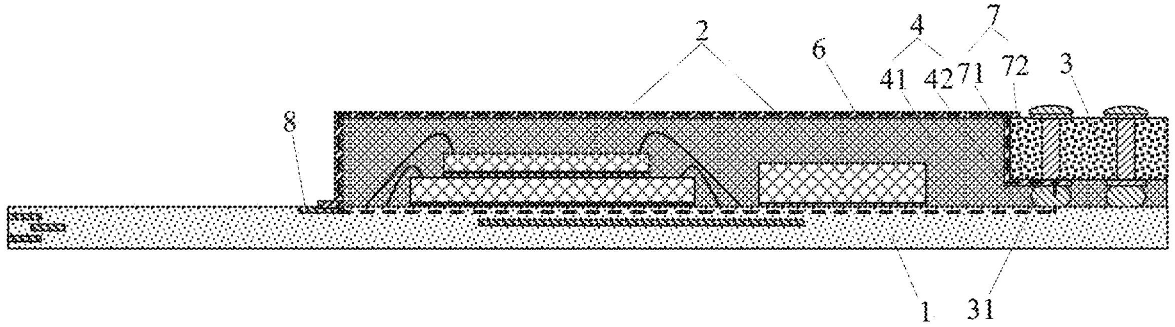
FIG. 8 is a schematic diagram of a third Faraday cage of an electronic device according to an embodiment of this application.

In this way, the substrate ground layer, the first shielding metal 6, the first shielding segment 71, the second shielding segment 72, the first ground pad 31 and the BGA solder ball form a quasi-closed space, that is, a "Faraday cage". Referring to FIG. 8, FIG. 8 is a schematic diagram of a third Faraday cage of an electronic device according to an embodiment of this application. The part shown by the dashed box in FIG. 8 may be regarded as a "Faraday cage". The effect that the "Faraday cage" can achieve has been described in the previous description, and details will not be described herein again.

During manufacturing of the first shielding metal 6 on a surface of the adapter board 3 facing away from the substrate 1, since the first shielding metal 6 only covers the first shielding segment 71, in order to avoid the impact of the spraying or sputtering process on other components of the adapter board 3, the surface of the adapter board 3 facing away from the substrate 1 may be covered with a shielding film to play the role of shielding.

Figure 9:
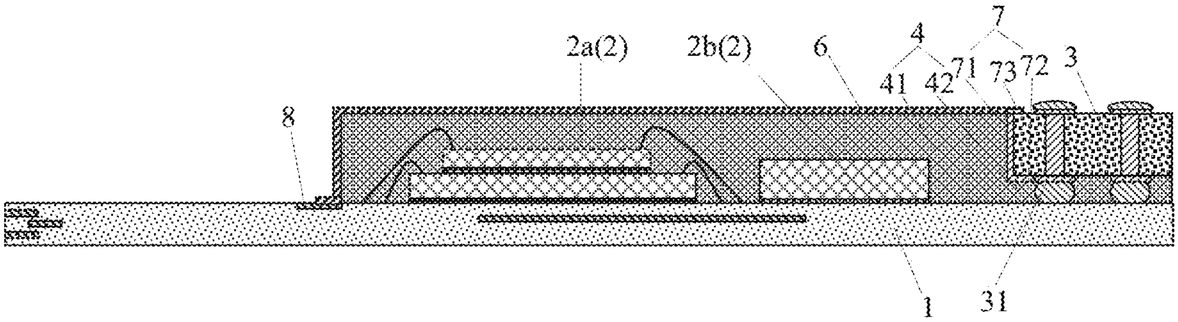
FIG. 9 is a fourth schematic structural diagram of an electronic device according to an embodiment of this application.

Referring to FIG. 9, FIG. 9 is a fourth schematic structural diagram of an electronic device according to an embodiment of this application. It may be seen from FIG. 9 that in order to realize the grounding of the first shielding metal 6, a second shielding metal 7 may further be arranged outside the adapter board 3 by spraying or sputtering. In addition to the first shielding segment 71 and the second shielding segment 72, the second shielding metal 7 further includes a third shielding segment 73.

The first shielding segment 71 is arranged on a side surface of the adapter board 3 facing the first crystal device 2, and an end of the first shielding segment 71 away from the substrate 1 is connected to the first shielding metal 6. One end of the second shielding segment 72 is connected to the first shielding segment 71, and an other end of the second shielding segment is connected to the first ground pad 31. The third shielding segment 73 is arranged on the surface of the adapter board 3 facing away form the substrate 1. One end of the third shielding segment 73 is connected to the first shielding segment 71, and an other end of the third shielding segment extends by a certain distance in a direction facing away from the first crystal device 2.

It can be seen from FIG. 9 that when the third shielding segment 73 extends toward the second ground pad 33, the third shielding segment 73 is not in contact with the second ground pad 33.

The first shielding metal 6 may extend in a direction facing away from the first crystal device 2 to completely cover the third shielding segment 73.

The first shielding metal 6 is connected to the first ground pad 31 by the third shielding segment 73, the first shielding segment 71, and the second shielding segment 72 after coming into contact with the third shielding segment 73, thereby realizing the grounding.

Figure 10:
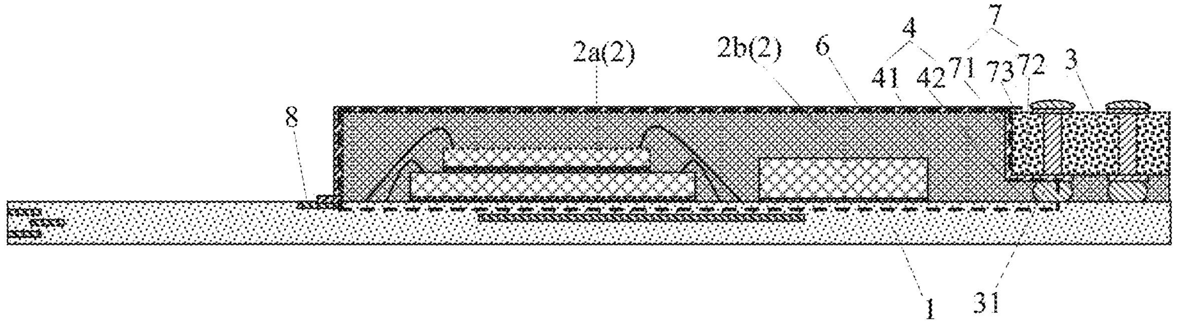
FIG. 10 is a schematic diagram of a fourth Faraday cage of an electronic device according to an embodiment of this application.

In this way, the substrate ground layer, the first shielding metal 6, the third shielding segment 73, the first shielding segment 71, the second shielding segment 72, the first ground pad 31, and the BGA solder ball form a quasi-closed space, that is, a "Faraday cage". Referring to FIG. 10, FIG. 10 is a schematic diagram of a fourth Faraday cage of an electronic device according to an embodiment of this application. The part shown by the dashed box in FIG. 10 may be regarded as a "Faraday cage". The effect that the "Faraday cage" can achieve has been described in the previous description, and details will not be described herein again.

During manufacturing of the first shielding metal 6 on the surface of the adapter board 3 facing away from the substrate 1, since the first shielding metal 6 only covers the third shielding segment 73, in order to avoid the impact of the spraying or sputtering process on other components of the adapter board 3, a shielding film may be arranged on the surface of the adapter board 3 facing away from the substrate 1, and it is ensured that the shielding film does not cover the third shielding segment 73, so as to play the role of shielding.

In some implementations, the adapter board 3 manufactured with the second shielding metal 7 may also include the first ground pad 31, the interconnect via 32, the second ground pad 33, and the like. The first ground pad 31 may be electrically connected to the substrate 1 by the BGA solder ball, and the surface of the second ground pad 33 may be plated with tin. The second ground pad 33 may be connected to other external devices by soldering, so that other external devices are connected to the first ground pad 31 by the second ground pad 33 and the interconnect via 32. The number of the first ground pads 31, interconnect vias 32, and second ground pads 33 included in the adapter board 3 may also be planned according to actual requirements, and the adapter board is not limited to including only one first ground pad 31, one interconnect via 32, and one second ground pad 33.

In the embodiment of this application, the first crystal device 2 may be packaged on the substrate 1 by soldering or bonding. For example, referring to FIG. 9, a first crystal device 2*a* is packaged on the substrate 1 by bonding, and is electrically connected to the substrate 1 by wire bonding (bonding), so that a first crystal device 2*b* is directly soldered to the substrate 1. It may be understood that, in addition to the packaging method shown in FIG. 9, other achievable packaging methods may further be adopted for the first crystal device 2, which is not limited in the embodiment of this application.

Figure 11:
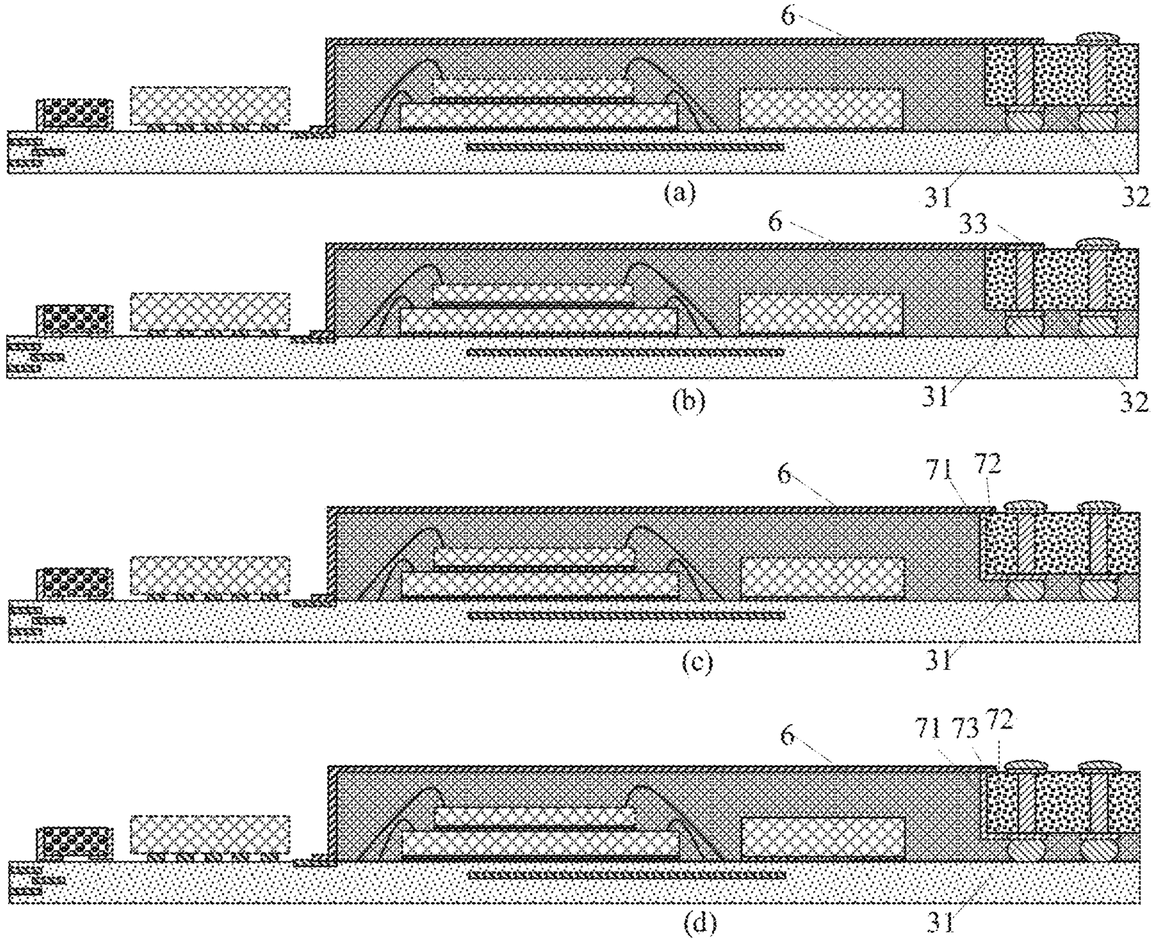
FIG. 11 is a schematic diagram of packaging of peripheral components according to an embodiment of this application.

In some implementations, the electronic device provided in the embodiment of this application further includes peripheral components. Referring to FIG. 11, FIG. 11 is a schematic diagram of packaging of peripheral components according to an embodiment of this application, FIG. 11(*a*) shows peripheral components of the electronic device of FIG. 3, FIG. 11(*b*) shows peripheral components of the electronic device of FIG. 5, FIG. 11(*c*) shows peripheral components of the electronic device of FIG. 7, and FIG. 11(*d*) shows peripheral components of the electronic device of FIG. 9. The peripheral components may be arranged on a side surface of the substrate 1, specifically arranged on a side of the first shielding metal 6 away from the first crystal device 2, and may be packaged by welding or bonding. The peripheral components may be gravity sensors or other devices that are not easily affected by electromagnetic signal interference.

In some implementations, the electronic device provided in the embodiment of this application may include one or more adapter boards 3, and the plurality of adapter boards 3 may be arranged along an edge of the substrate 1. The number and specific arrangement positions of the adapter boards 3 may be designed according to the actual situation, which is not specifically limited in this application.

Figure 12:
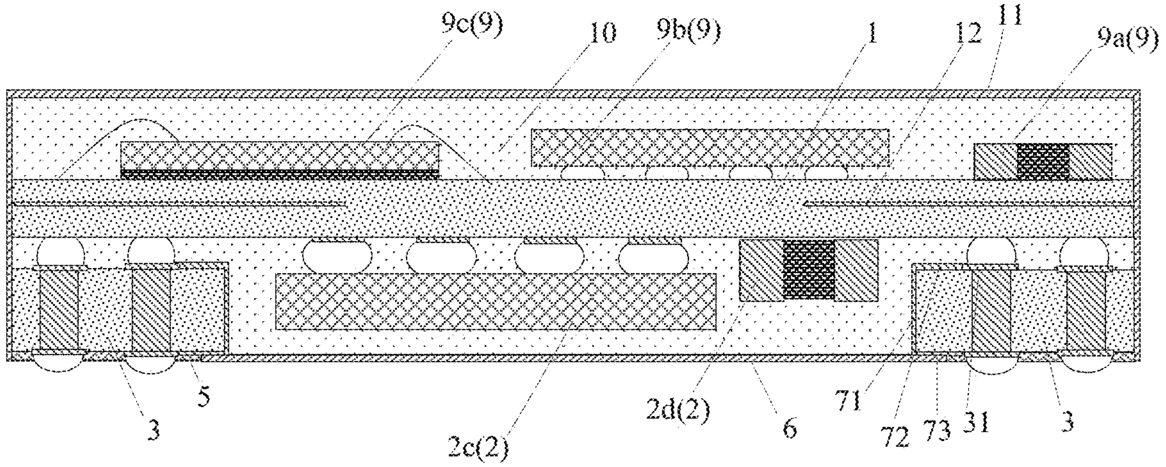
FIG. 12 is a fifth schematic structural diagram of an electronic device according to an embodiment of this application.

Referring to FIG. 12, FIG. 12 is a fifth schematic structural diagram of an electronic device according to an embodiment of this application. It may be seen from FIG. 12 that the adapter board 3 provided in the embodiment of this application is distributed on the edge of the substrate 1. Since FIG. 12 is a schematic diagram formed by vertically slicing the electronic device, in FIG. 12, a plurality of adapter boards 3 are distributed on both sides of the first crystal device 2.

It may be understood that the package form of the first crystal device 2 shown in FIG. 12 is only an example, and does not constitute a specific limitation on the package form of the first crystal device 2. For example, A first crystal device 2*c* may be electrically connected to the substrate 1 by BGA solder balls, so that a first crystal device 2*d* can be directly soldered to the substrate 1.

Figure 13:
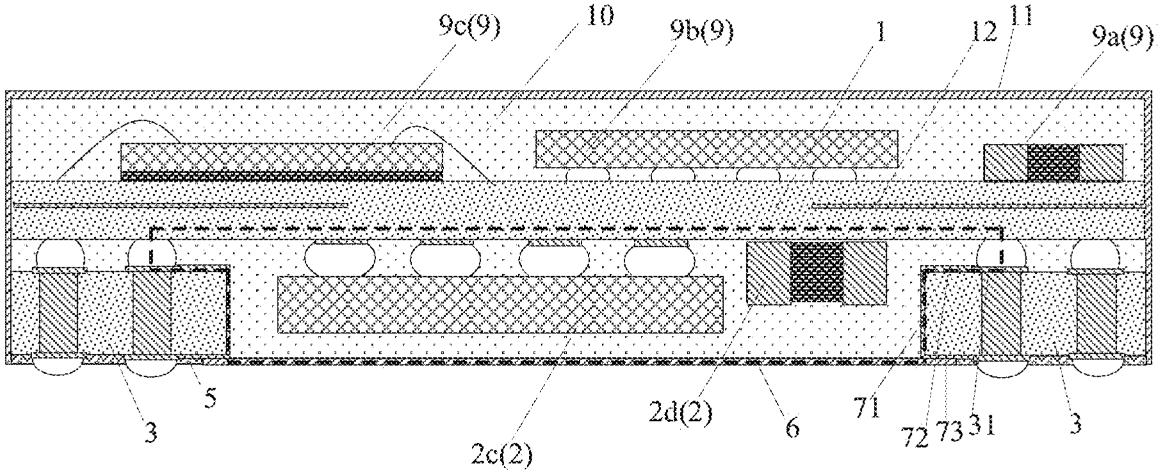
FIG. 13 is a schematic diagram of a fifth Faraday cage of an electronic device according to an embodiment of this application.

Referring to FIG. 13, FIG. 13 is a schematic diagram of a fifth Faraday cage of an electronic device according to an embodiment of this application. The part shown by the dashed box in FIG. 13 may be regarded as a "Faraday cage". It can be seen from FIG. 13 that in a case that the number of adapter boards 3 is two, two ends of the first shielding metal 6 are connected to the first ground pad 31 by the third shielding segment 73, the first shielding segment 71, and the second shielding segment 72, so as to realize the grounding. In this case, the substrate ground layer, the first shielding metal 6, two third shielding segments 73, two first shielding segments 71, two first ground pads 31, and the BGA solder balls form a quasi-closed space, that is, a "Faraday cage".

Figure 14:
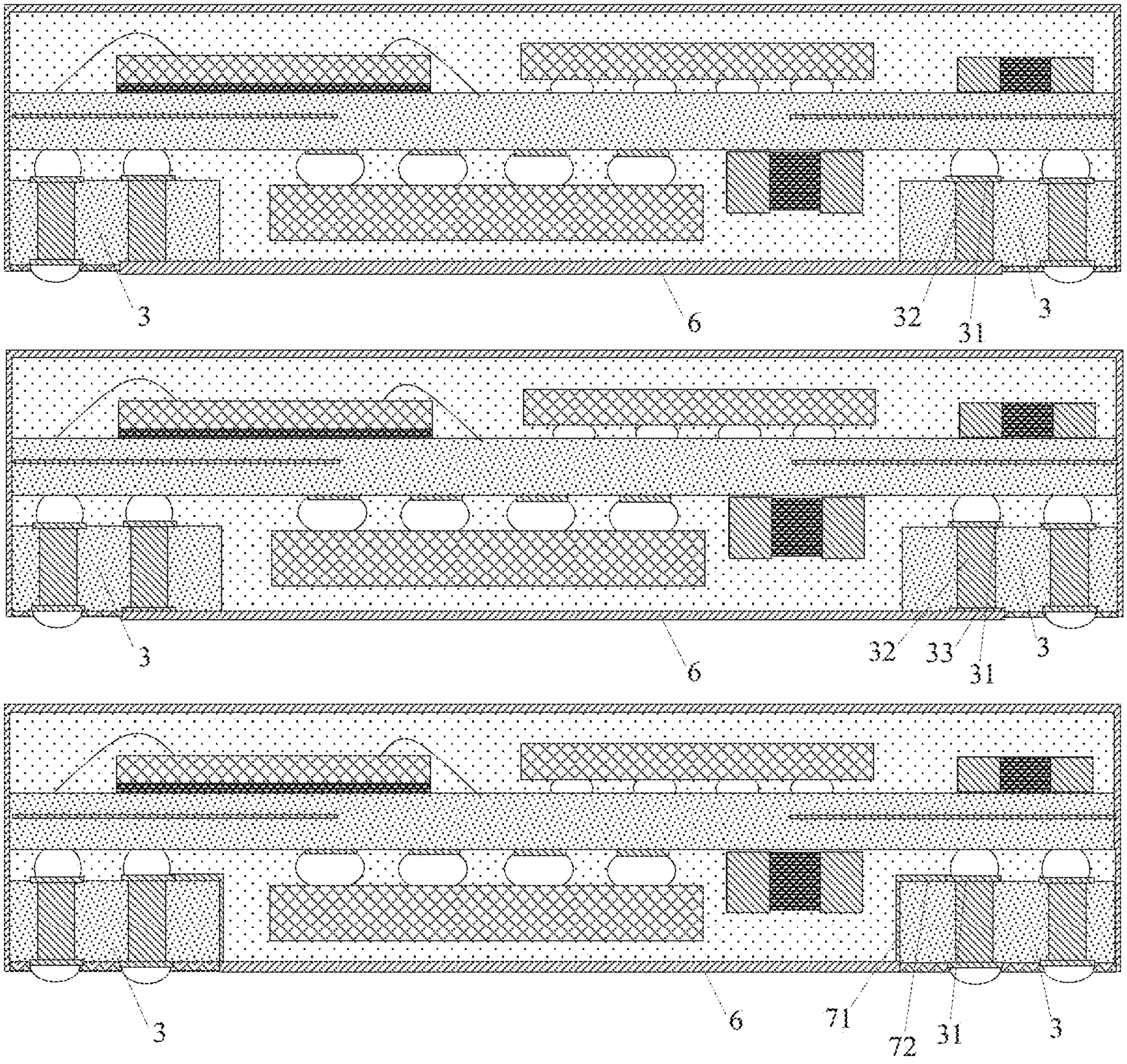
FIG. 14 is a schematic diagram of a first shielding metal that is grounded according to an embodiment of this application.

In some implementations, in a case that a plurality of adapter boards 3 are arranged, the grounding manner of the first shielding metal 6 may be not only the manner of matching by the third shielding segment 73, the first shielding segment 71, and the second shielding segment 72, but also the manner of matching by the interconnect vias 32, and the like. For details, reference may be made to FIG. 14, and details will not be described herein again.

For an electronic device having a relatively large number of components, on the premise of ensuring miniaturization, the components are generally packaged in a stacking manner. The electronic device provided in the embodiment of this application is used as an example. The components may be arranged on either one side of the substrate 1 or an other side of the substrate 1. Therefore, the shielding properties of the components on the other side of the substrate 1 should also be ensured during packaging.

Still referring to FIG. 12, the electronic device provided in the embodiment of this application further includes a second crystal device 9, a second plastic packaging layer 10, a third shielding metal 11, and a ground metal layer 12.

The second crystal device 9 is arranged on an other surface of the substrate 1, and the second plastic packaging layer 10 is arranged on a surface of the second crystal device 9.

During specific implementation, the second crystal device 9 may be packaged on the substrate 1 by soldering or bonding.

The second plastic packaging layer 10 can be wrapped around the second crystal device 9, so as to achieve the functions of insulation, heat dissipation, and dust prevention. In addition, the second crystal device 9 can be prevented from being displaced or damaged when subjected to an external force. The second plastic packaging layer 10 may be formed of a molding compound and shaped by a molding jig.

The third shielding metal 11 covers the surface of the second plastic packaging layer 10 and the side surface of the substrate 1. The ground metal layer 12 is located inside the substrate 1, extends from the inside of the substrate 1 to the side surface of the substrate 1, and is connected to the third shielding metal 11.

During specific implementation, the third shielding metal 11 may be manufactured and formed on the surface of the second plastic packaging layer 10 and the side surface of the substrate 1 by spraying or sputtering, and a thickness of the third shielding metal 11 may be designed according to the actual situation.

After the third shielding metal 11 covers the surface of the second plastic packaging layer 10 and the side surface of the substrate 1, and is completely wrapped around the second crystal device 9, the second crystal device 9 is isolated from other devices. The third shielding metal 11 may be grounded through the ground metal layer 12 extending from the inside of the substrate 1, to achieve the shielding effect on the second crystal device 9, so as to avoid mutual interference between the second crystal device 9 and other devices, avoid the electromagnetic interference of the second crystal device 9 from the external environment, and prevent the second crystal device 9 from interfering with the outside.

The third shielding metal 11 may further cover a side surface of the second part 42 facing away from the first crystal device 2, and may further cover the surface of the adapter board 3 facing away from the first crystal device 2.

It may be seen from FIG. 12 that a complete shielding layer may be formed by the covering of the third shielding metal 11 to separate the substrate 1 and the second crystal device 9 from the outside, so that the shielding effect is more significant.

Upon completion of double-sided packaging, the first crystal device 2 on one side of the substrate 1 and the adapter board 3 can be shielded from each other, and the second crystal device 9 on an other side surface of the substrate 1 can also be separated from the outside.

In some implementations, the first crystal device 2 may include one or more of a NOR flash memory (nor flash), a MOS transistor, an SoC chip, a decoding circuit (codec IC), a charging chip (charger), an RLC (resistor, inductor, capacitor) device, a crystal, a Bluetooth chip, a radio frequency chip, a Wi-Fi chip, an NFC chip, or a sensor. The second crystal device 9 may include one or more of a NOR flash memory (nor flash), a MOS transistor, an SoC chip, a decoding circuit (codec IC), a charging chip (charger), an RLC device, a crystal, a Bluetooth chip, a radio frequency chip, a Wi-Fi chip, an NFC chip, or a sensor The first crystal device 2 and the second crystal device 9 may further be other types of chips, which is not specifically limited in this application.

In some implementations, it may be seen from FIG. 12 that the electronic device provided in the embodiment of this application further includes a soldering-resist layer 5. The soldering-resist layer 5 covers the surface of the adapter board 3 facing away from the substrate 1. During operations such as soldering the adapter board 3 to the substrate 1 by using the reflow soldering technology and plating tin on the second ground pad 33 of the adapter board 3, it may be ensured that a position where the soldering-resist layer 5 is arranged is not covered by the tin solder.

Figure 15:
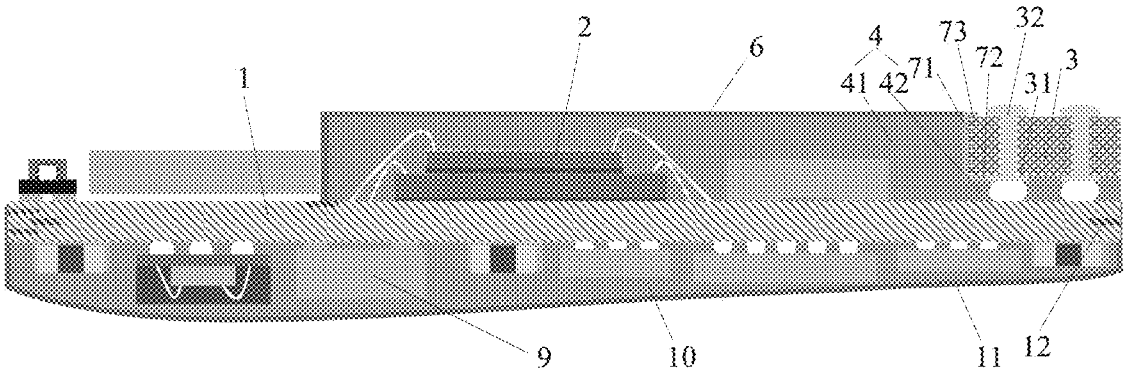
FIG. 15 is a schematic structural diagram of a TWS headset according to an embodiment of this application.

In some implementations, the electronic device provided in the embodiment of this application may be a TWS headset. Referring to FIG. 15, FIG. 15 is a schematic structural diagram of a TWS headset according to an embodiment of this application. It may be seen from FIG. 15 that a TWS headset package may include a substrate 1 and a first crystal device 2 and an adapter board 3 that are arranged on a side surface of the substrate 1 in parallel. A number of adapter boards 3 included in the TWS headset during packaging may be one. The adapter board 3 includes a first ground pad 31. The first ground pad 31 is arranged on a surface of the adapter board 3 facing the substrate 1, and the adapter board 3 is electrically connected to the substrate 1 by the first ground pad 31, so that the adapter board 3 is grounded. Specifically, the adapter board 3 may be packaged on the substrate 1 by using BGA solder balls. The adapter board 3 may further include an interconnect via 32 and a second ground pad 32. The second ground pad 32 may be plated with tin. A first part 41 is arranged on a surface of the first crystal device 2, and a second part 42 is arranged between the adapter board 3 and the first ground pad 31. The first part 41 and the second part 42 are integrally formed and form a first plastic packaging layer 4. The TWS headset further includes a second shielding metal 7. The second shielding metal 7 includes a first shielding segment 71, a second shielding segment 72, and a third shielding segment 73, The first shielding segment 71 is arranged on a side surface of the adapter board 3 facing the first crystal device 2, and an end of the first shielding segment 71 away from the substrate 1 is connected to a first shielding metal 6. One end of the second shielding segment 72 is connected to the first shielding segment 71, and an other end of the second shielding segment is connected to the first ground pad 31. The third shielding segment 73 is arranged on the surface of the adapter board 3 facing away from the substrate 1. One end of the third shielding segment 73 is connected to the first shielding segment 71, and an other end of the third shielding segment extends by a certain distance in a direction facing away from the first crystal device 2. The third shielding segment 73 is connected to the first shielding metal 6. A third ground pad 8 is further arranged on the substrate 1. The third ground pad 8 is arranged at a position where the first shielding metal 6 comes into contact with the substrate 1. The first shielding metal 6 is connected to the third ground pad 8. In this way, the first shielding metal 6 is grounded by using the third ground pad 8 and the second shielding metal 7, and the substrate 1 is manufactured with a ground layer in advance.

The TWS package further includes a second crystal device 9, a second plastic packaging layer 10, a third shielding metal 11, and a ground metal layer 12. The second crystal device 9 is arranged on an other side surface of the substrate 1, and the second plastic packaging layer 10 is arranged on a surface of the second crystal device 9. The third shielding metal 11 covers the surface of the second plastic packaging layer 10 and the side surface of the substrate 1, further covers the side surface of the second part 42 facing away from the first crystal device 2, and further covers the side surface of the adapter board 3 facing away from the first crystal device 2. The ground metal layer 12 is located inside the substrate 1, extends from the inside of the substrate 1 to the side surface of the substrate 1, and is connected to the third shielding metal 11.

Specifically, the first crystal device 2 may be specifically a NOR flash memory (nor flash), a SoC chip, and a crystal, the second crystal device 9 may be specifically a charging chip (charger), a decoding circuit (codec IC), a sensor, an RLC device, a MOS transistor, and the like, and the peripheral components may be specifically gravity sensors.

It may be understood that, during packaging of the TWS headset, the first shielding metal 6 may further be grounded in other manners. For details, reference may be made to the above, and the details will not be described herein again.

An embodiment of this application further provides a chip packaging method. The method may be applicable to the packaging field of electronic devices, especially to an electronic device with a circuit board configured to transmit a signal.

Figure 16:
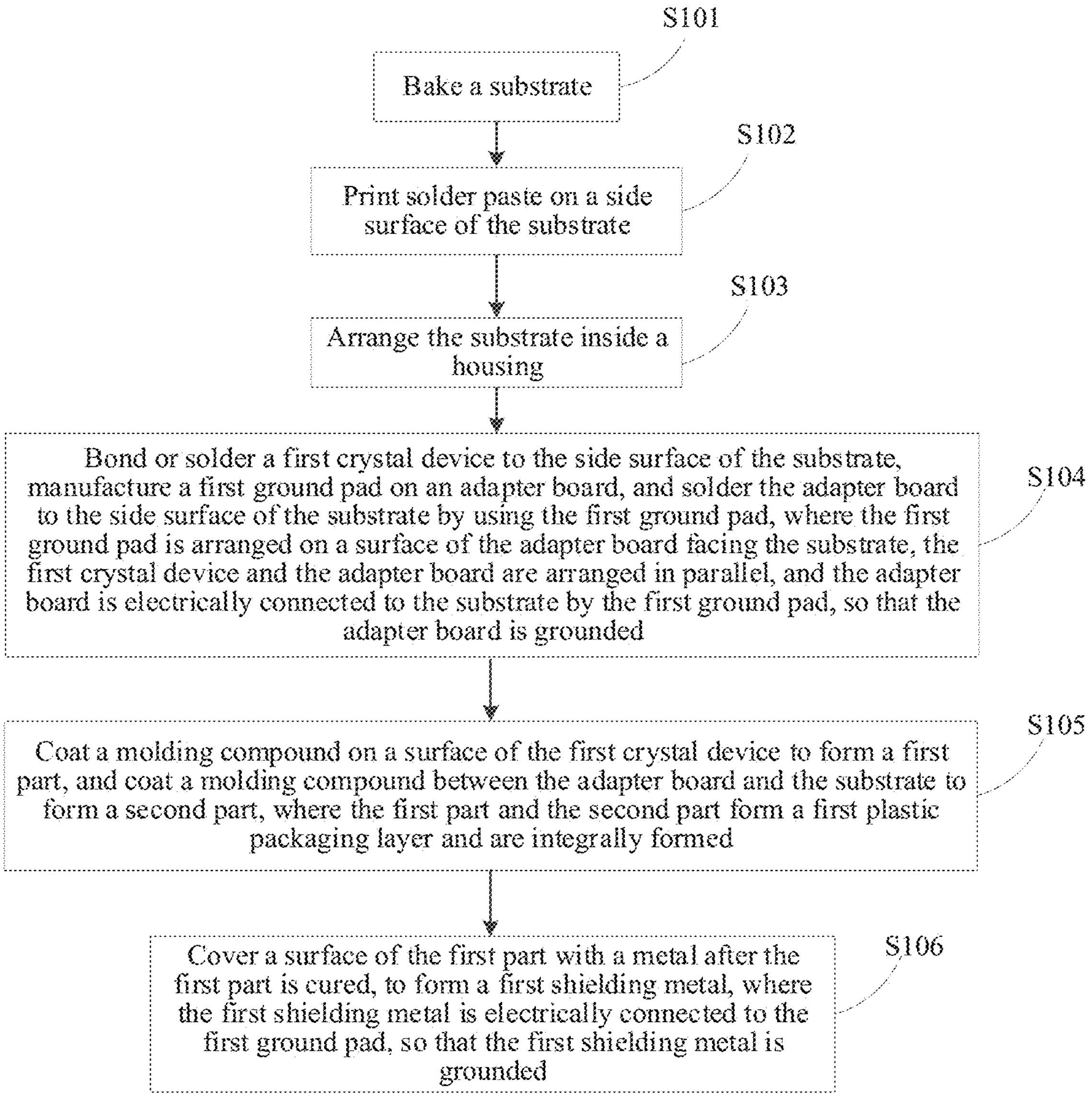
FIG. 16 is a schematic flowchart of a chip packaging method according to an embodiment of this application.
Figure 17:
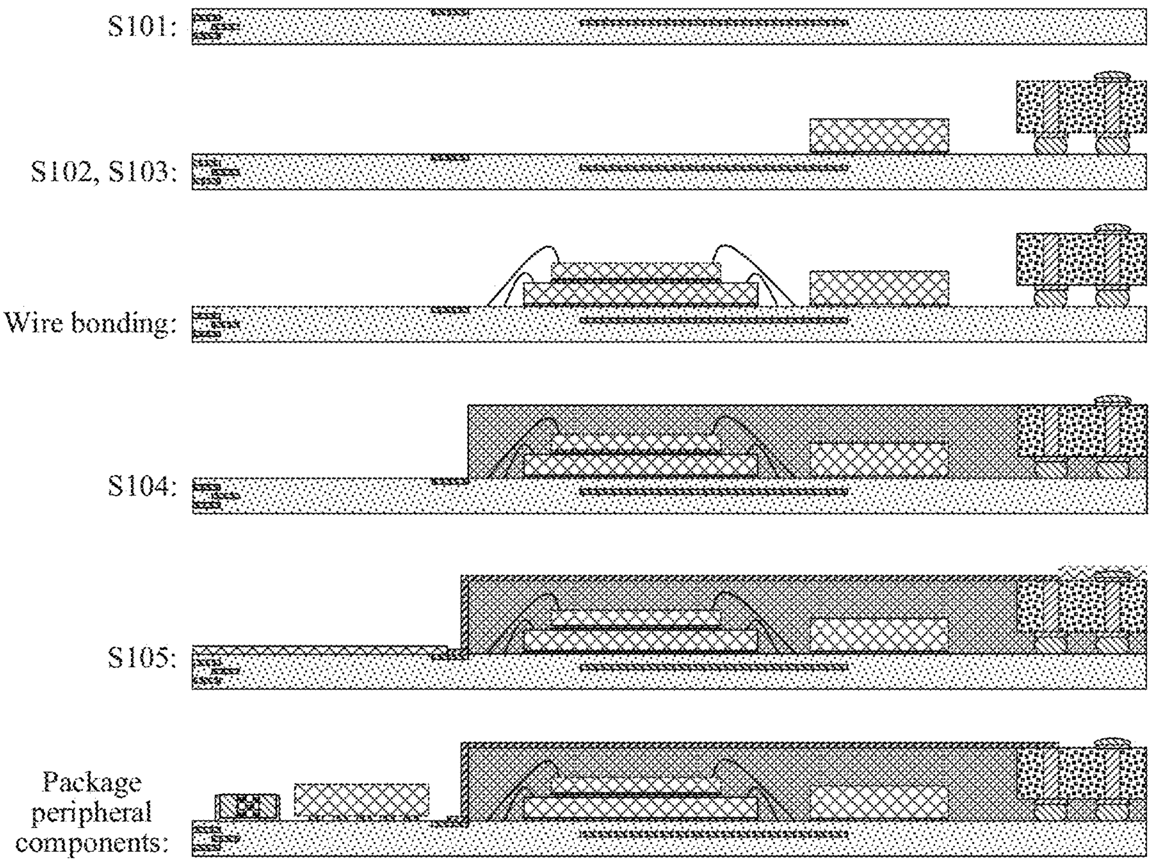
FIG. 17 is an exploded view of a chip packaging method according to an embodiment of this application.

FIG. 16 is a schematic flowchart of a chip packaging method according to an embodiment of this application. FIG. 17 is an exploded view of a chip packaging method according to an embodiment of this application.

The method provided in the embodiment of this application is specifically described below. As shown in FIG. 16, the method may include the following steps.

S101: Baking a Substrate 1.

The substrate 1 may be a circuit board on which ground layer wiring is performed and pads are arranged, and may specifically be a printed circuit board (printed circuit board, PCB) or a flexible printed circuit board (flexible printed circuit board, FPC).

Since the substrate 1 is corroded by moisture and the like during the storage, the substrate 1 with relatively large moisture is prone to burst during packaging. In order to ensure the packaging effect of the substrate 1, the substrate 1 is baked before the packaging operation. The temperature and duration of baking may be at 120° C. for 8 hours, at 150° C. for 4-6 hours, at 125° C. for 24 hours, or the like. The exact baking temperature and duration may be selected according to the actual situation.

During the manufacturing of the substrate 1, a third ground pad 8 is further arranged to facilitate the subsequent grounding of the first shielding metal 6. The specific manufacturing position of the third ground pad 8 is to be described in detail below.

S102: Printing solder paste on a side surface of the substrate 1.

During soldering and packaging of the device, the solder can play the role of flux.

S103: Arranging the substrate 1 inside a housing 13.

S104: Bonding or soldering a first crystal device 2 to a side surface of the substrate 1, manufacturing a first ground pad 31 on an adapter board 3, and soldering the adapter board 3 to the side surface of the substrate 1 by using the first ground pad 31, where the first ground pad 31 is arranged on a surface of the adapter board 3 facing the substrate 1, the first crystal device 2 and the adapter board 3 are arranged in parallel, and the adapter board 3 is electrically connected to the substrate 1 by the first ground pad 31, so that the adapter board 3 is grounded.

During specific implementation, the first ground pad 31 may be manufactured in advance on the adapter board 3, and after the first ground pad 31 is manufactured, the adapter board 3 is soldered to the substrate 1.

The bonding the first crystal device 2 may specifically include the following steps.

S1041: Performing plasma cleaning on the side surface of the substrate 1.

The step of performing plasma cleaning may be used to remove excess flux, oil stains, and the like on the surface of the substrate 1 to prepare for bonding.

S1042: Dispensing adhesive on the side surface of the substrate 1.

The step is specifically dispensing adhesive at a position of the first crystal device 2 that needs to be bonded.

S1043: Bonding the first crystal device 2 on the side surface of the substrate 1.

S1044: Performing wire bonding between the first crystal device 2 and the substrate 1.

Wire bonding (bonding) is a way to achieve electrical connection. After the wire bonding is performed between the first crystal device 2 and the substrate 1, the electrical connection between the first crystal device 2 and the substrate 1 is realized.

Still referring to FIG. 16, the chip packaging method provided in the embodiment of this application further includes the following steps.

S105: Coating a molding compound on a surface of the first crystal device 2 to form a first part 41, and coating a molding compound between the adapter board 3 and the substrate 1 to form a second part 42. The first part 41 and the second part 42 form a first plastic packaging layer 4, and the first part 41 and the second part 42 are integrally formed.

The first part 41 and the second part 42 need to be cured for a period of time, after the curing, the first part 41 can be wrapped around the first crystal device 2, and the second part 42 can be filled between the adapter board 3 and the substrate 1, so as to achieve the functions of insulation, heat dissipation, and dust prevention. In addition, the first crystal device 2 and the adapter board 3 can be prevented from being displaced or damaged when subjected to an external force.

The first part 41 and the second part 42 may be shaped by a molding jig. The molding compound may include epoxy resin, organic silicone resin materials, and the like.

The coating height of the first part 41 may be flush with the height of the adapter board 3 to ensure that the packaged electronic device has desirable flatness and provide a flat plane for the subsequent manufacturing of the shielding metal. In addition, a coating position of the first part 41 at one end away from the first crystal device 2 may be flush with the edge of the third ground pad 8 to facilitate subsequent manufacturing of the first shielding metal 6.

Before the manufacturing of the first part 41 and the second part 42, plasma cleaning may further be performed on the substrate 1 to remove residual glue and the like on the surface of the substrate 1.

S106: Covering a surface of the first part 41 with a metal after the first part 41 is cured, to form a first shielding metal 6, where the first shielding metal 6 is electrically connected to the first ground pad 31, so that the first shielding metal 6 is grounded.

During specific implementation, the covering method of the first shielding metal 6 may adopt the process of spraying or sputtering. The process of spraying or sputtering has a wide coverage during implementation. When the first part 41 is sprayed or sputtered, the surface of the adapter board 3 facing away from the substrate 1 may be affected. Therefore, the surface of the adapter board 3 facing away from the substrate 1 needs to be covered with a shielding film to achieve the effect of shielding. The specific coverage of the shielding film is related to the extending distance of the first shielding metal 6 on the surface of the adapter board 3 facing away from the substrate 1, which is to be described in detail below.

In some implementations, it may be seen from FIG. 11 that the chip packaging method provided in the embodiment of this application may further include packaging some peripheral components. The peripheral components may be arranged on a side surface of the substrate 1, specifically arranged on a side of the first shielding metal 6 away from the first crystal device 2, and may be packaged by welding or bonding. The peripheral components may be gravity sensors, or the like. The specific manufacturing step is: first printing solder paste on the surface of the substrate 1 on which peripheral components need to be manufactured, and then soldering the peripheral components to the corresponding positions by using the reflow soldering technology. When the adapter board 3 is covered with the shielding film, the position of the substrate 1 for packaging the peripheral components is also covered with the shielding film, so as to avoid the impact of the spraying or sputtering of the first shielding metal 6 on the packaging of the subsequent peripheral components.

The chip packaging method provided in the embodiment of this application further includes the following steps.

S107: Manufacturing a third ground pad 8 at a position where the first shielding metal 6 comes into contact with the substrate 1, where the first shielding metal 6 is connected to the third ground pad 8, so that the first shielding metal 6 is grounded.

During specific implementation, the first shielding metal 6 may cover part of the third ground pad 8 to ensure that the first shielding metal 8 can be connected to the ground layer of the substrate 1 by the third ground pad 8.

In an implementation, an end of the first shielding metal 6 away from the adapter board 3 is grounded by the third ground pad 8, and the side of the first shielding metal 6 close to the adapter board 3 may be grounded by using the following S107 and S108.

Still refer to FIG. 17.

S108: Manufacturing an interconnect via 32 on the adapter board 3, where one end of the interconnect via 32 is connected to the first ground pad 31, and an other end of the interconnect via extends through a surface of the adapter board 3 facing away from the substrate 1.

During specific implementation, this step may be completed before performing S104, that is, the manufacturing of the adapter board 3 is completed before the adapter board 3 is soldered to the substrate 1.

S109: The first shielding metal 6 extends from the surface of the first part 41 to the surface of the adapter board 3 facing away from the substrate 1, and is connected to the interconnect via 32, so that the first shielding metal 6 is connected to the first ground pad 31 through the interconnect via 32.

During specific implementation, S109 may be performed simultaneously when the first shielding metal 6 is manufactured in S106, to realize the grounding of the first shielding metal 6.

It is to be noted that, during manufacturing of the first shielding metal 6 on the surface of the adapter board 3 facing away from the substrate 1, since the first shielding metal 6 only covers the interconnect via 32, in order to avoid the impact of the spraying or sputtering process on other components of the adapter board 3, a position on the adapter board 3 except the interconnect via 32 may be covered with a shielding film to play the role of shielding. Reference may be made to 17 for the specific covering position of the shielding film.

In an implementation, an end of the first shielding metal 6 away from the adapter board 3 is grounded by the third ground pad 8, and the side of the first shielding metal 6 close to the adapter board 3 may further be grounded by using the following S110 and S111.

Figure 18:
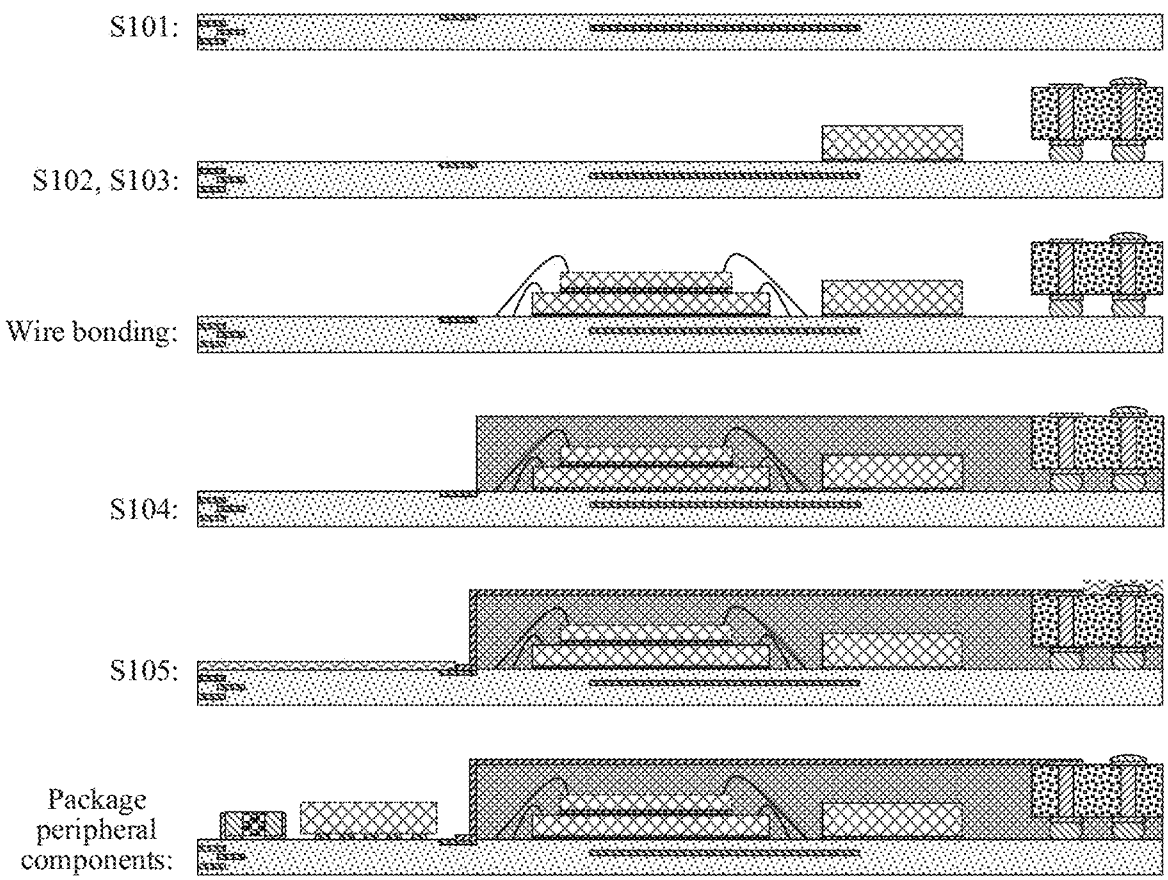
FIG. 18 is an exploded view of packaging of another first shielding metal according to an embodiment of this application.

Referring to FIG. 18, FIG. 18 is an exploded view of packaging of another first shielding metal according to an embodiment of this application.

S110: Manufacturing an interconnect via 32 and a second ground pad 33 on an adapter board 3. The second ground pad 33 is arranged on a surface of the adapter board 3 facing away from the substrate 1, and two ends of the interconnect via 32 are respectively connected to the first ground pad 31 and the second ground pad 33.

During specific implementation, this step may be completed before performing S103, that is, the manufacturing of the adapter board 3 is completed before the adapter board 3 is soldered to the substrate 1.

S111: The first shielding metal 6 extends from the surface of the first part 41 to the surface of the adapter board 3 facing away from the substrate 1, and is connected to the second ground pad 33, so that the first shielding metal 6 is connected to the first ground pad 31 by the second ground pad 33 and the interconnect via 32.

During specific implementation, Sill may be performed simultaneously when the first shielding metal 6 is manufactured in S106, to realize the grounding of the first shielding metal 6.

It is to be noted that, during manufacturing of the first shielding metal 6 on a surface of the adapter board 3 facing away from the substrate 1, since the first shielding metal 6 only covers the second ground pad 33, in order to avoid the impact of the spraying or sputtering process on other components of the adapter board 3, a position on the adapter board 3 except the second ground pad 33 may be covered with a shielding film to play the role of shielding.

In an implementation, an end of the first shielding metal 6 away from the adapter board 3 is grounded by the third ground pad 8, and the side of the first shielding metal 6 close to the adapter board 3 may further be grounded by using the following S112 and S113.

Figure 19:
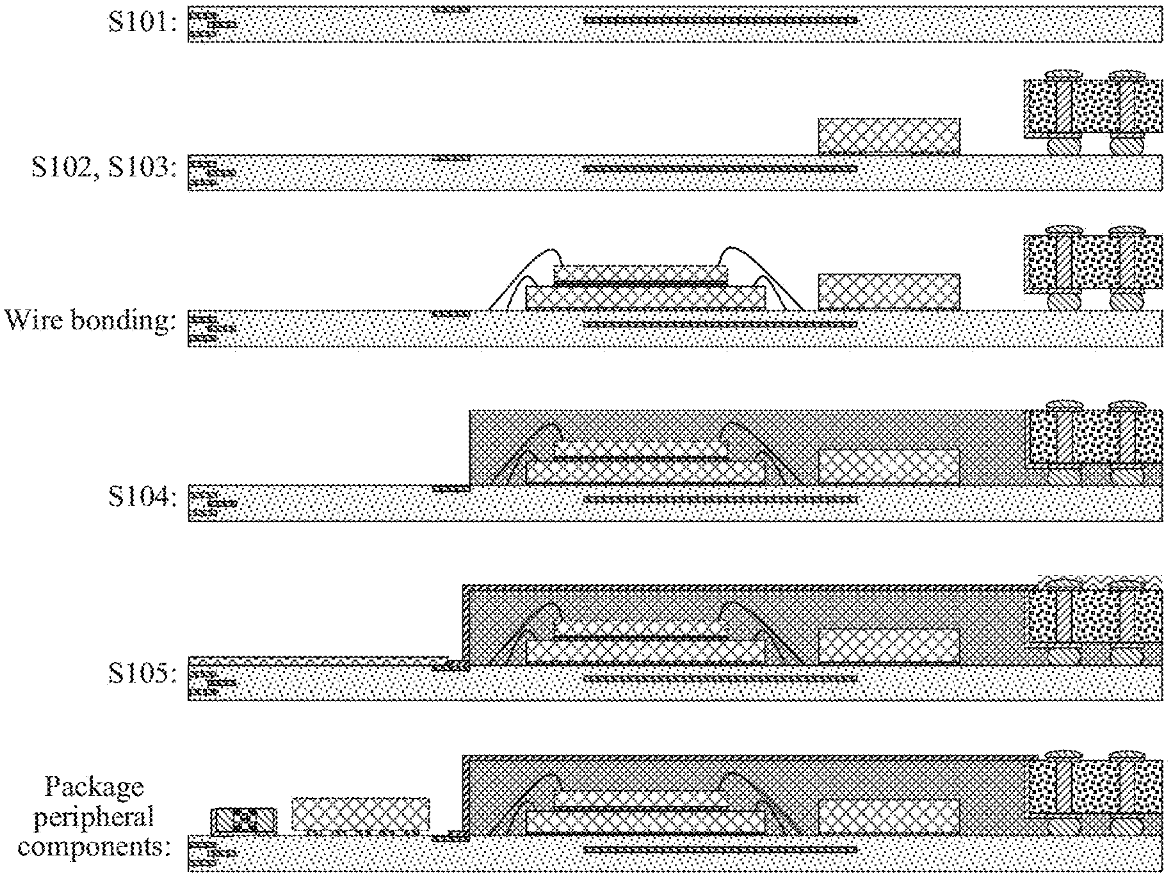
FIG. 19 is an exploded view of packaging of another first shielding metal according to an embodiment of this application.

Referring to FIG. 19, FIG. 19 is an exploded view of packaging of another first shielding metal according to an embodiment of this application.

S112: Covering a side surface of an adapter board 3 facing a first crystal device 2 with a metal to form a first shielding segment 71, where an end of the first shielding segment 71 away from a substrate 1 is connected to a first shielding metal 6.

S113: Covering a surface of the adapter board 3 facing the substrate 1 with a metal to form a second shielding segment 72, where one end of the second shielding segment 72 is connected to the first shielding segment 71, an other end of the second shielding segment is connected to a first ground pad 31.

The first shielding segment 71 and the second shielding segment 72 form a second shielding metal 6.

During specific implementation, the step of forming the second shielding metal 6 is completed before performing S104, that is, the manufacturing of the adapter board 3 is completed before the adapter board 3 is soldered to the substrate 1.

It is to be noted that during manufacturing of the first shielding metal 6 on a surface of the adapter board 3 facing away from the substrate 1, since the first shielding metal 6 only covers the first shielding segment 71, in order to avoid the impact of the spraying or sputtering process on other components of the adapter board 3, the surface of the adapter board 3 facing away from the substrate 1 may be covered with a shielding film to play the role of shielding.

In an implementation, an end of the first shielding metal 6 away from the adapter board 3 is grounded by the third ground pad 8, and the side of the first shielding metal 6 close to the adapter board 3 may further be grounded by using the following S113.

Figure 20:
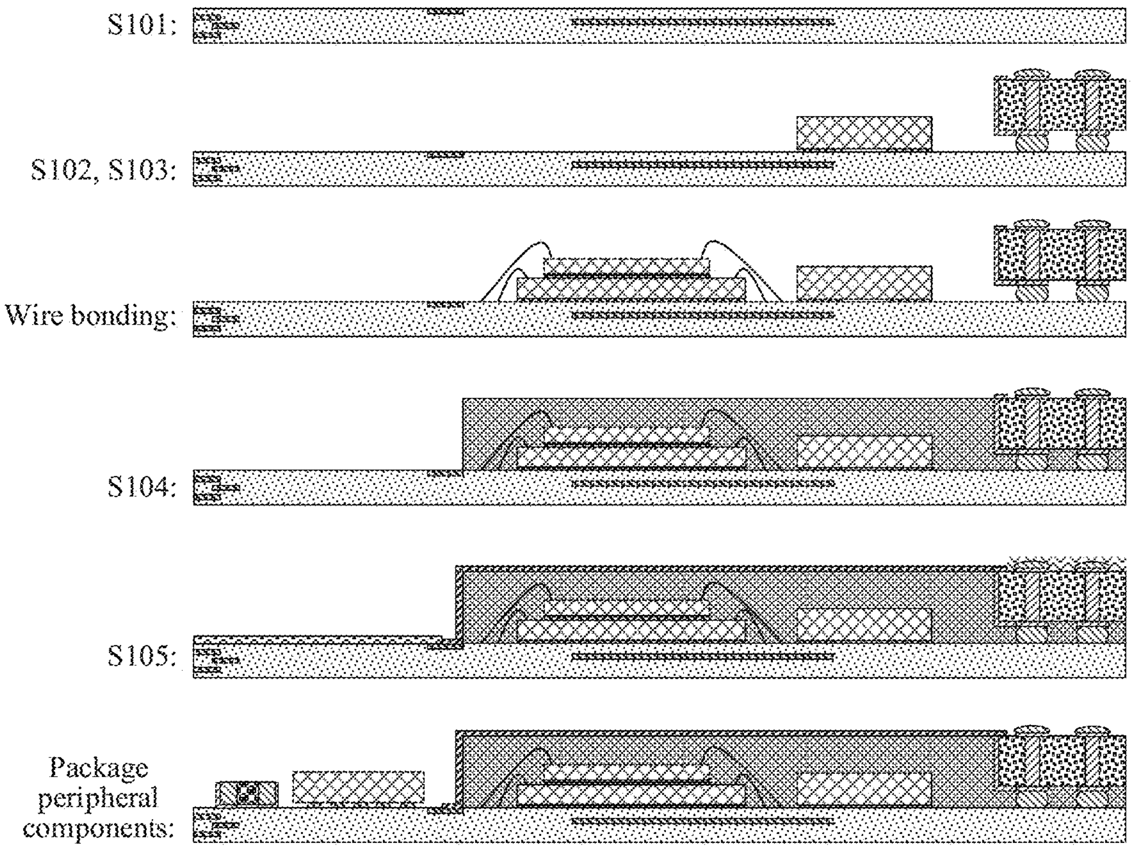
FIG. 20 is an exploded view of packaging of another first shielding metal according to an embodiment of this application.

The second shielding metal 7 may include not only the first shielding segment 71 and the second shielding segment 72 but also a third shielding segment 73, so as to realize the grounding of the first shielding metal 6. Referring to FIG. 20, FIG. 20 is an exploded view of packaging of another first shielding metal according to an embodiment of this application. Specific steps are as follows.

S114: Covering a surface of an adapter board 3 facing away from a substrate 1 with a metal to form a third shielding segment 73, where one end of the third shielding segment 73 is connected to the first shielding segment 71, an other end of the third shielding segment extends toward a second ground pad 33 by a certain distance, and the third shielding segment 73 is connected to a first shielding metal 6.

The first shielding segment 71, the second shielding segment 72, and the third shielding segment 73 form a second shielding metal 7.

During specific implementation, the step of forming the second shielding metal 6 is completed before performing S104, that is, the manufacturing of the adapter board 3 is completed before the adapter board 3 is soldered to the substrate 1.

It is to be noted that, during manufacturing of the first shielding metal 6 on the surface of the adapter board 3 facing away from the substrate 1, since the first shielding metal 6 only covers the third shielding segment 73, in order to avoid the impact of the spraying or sputtering process on other components of the adapter board 3, a shielding film may be arranged on the surface of the adapter board 3 facing away from the substrate 1, and it is ensured that the shielding film does not cover the third shielding segment 73, so as to play the role of shielding.

In some implementations, the number of adapter boards 3 may be one or more. The method for packaging the adapter board 3 may further include the following steps.

S115: Soldering the adapter boards 3 to the side surface of the substrate 1 by using the first ground pad 31, where the adapter board 3 is distributed on an edge of the substrate 1.

A plurality of adapter boards 3 may be soldered on the basis of S104, and for the specific soldering method, reference may be made to the description of S104. The plurality of adapter boards 3 may be arranged along the edge of the substrate 1, and the number and specific arrangement positions of the adapter boards 3 may be designed according to the actual situation, which is not specifically limited in this application.

Figure 21:
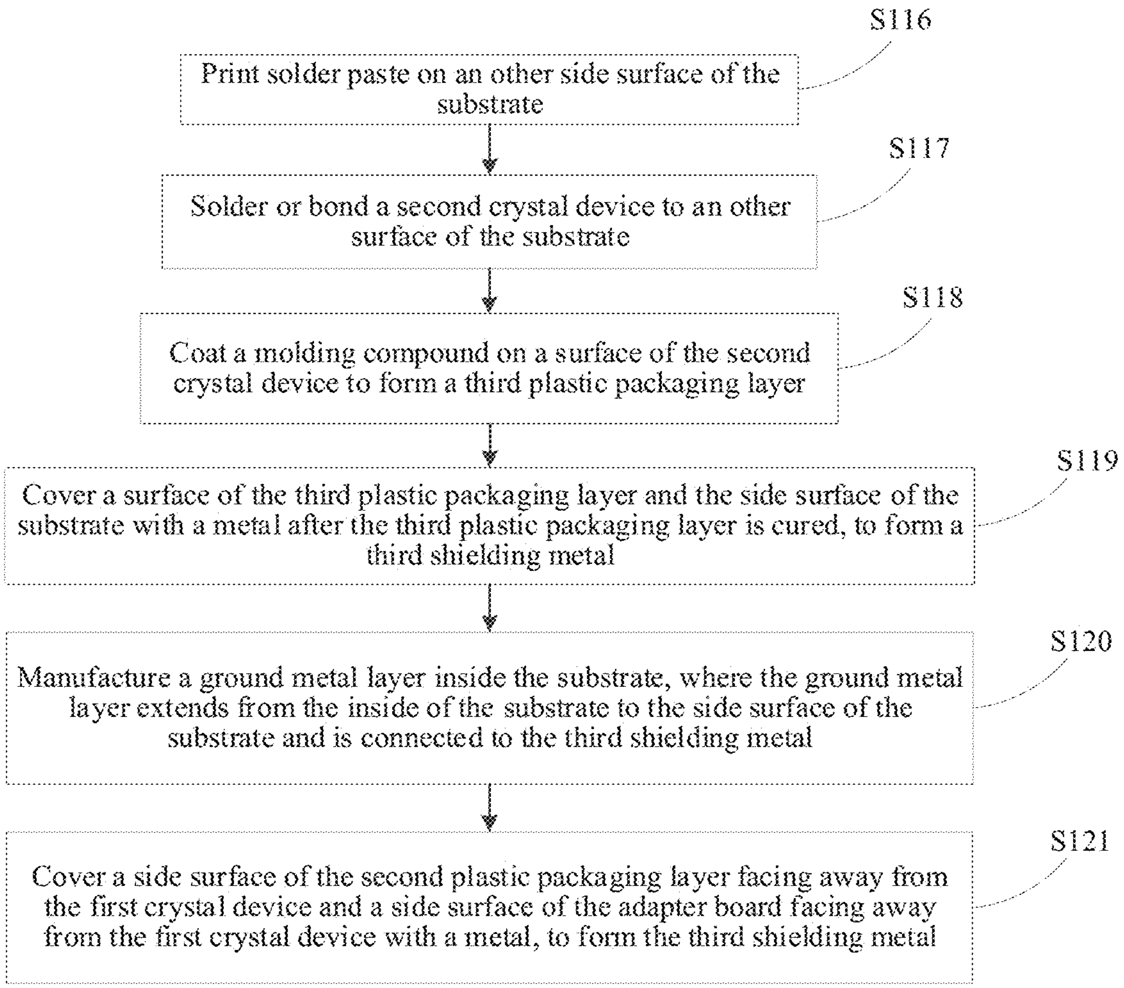
FIG. 21 is a schematic flowchart of another chip packaging method according to an embodiment of this application.
Figure 22:
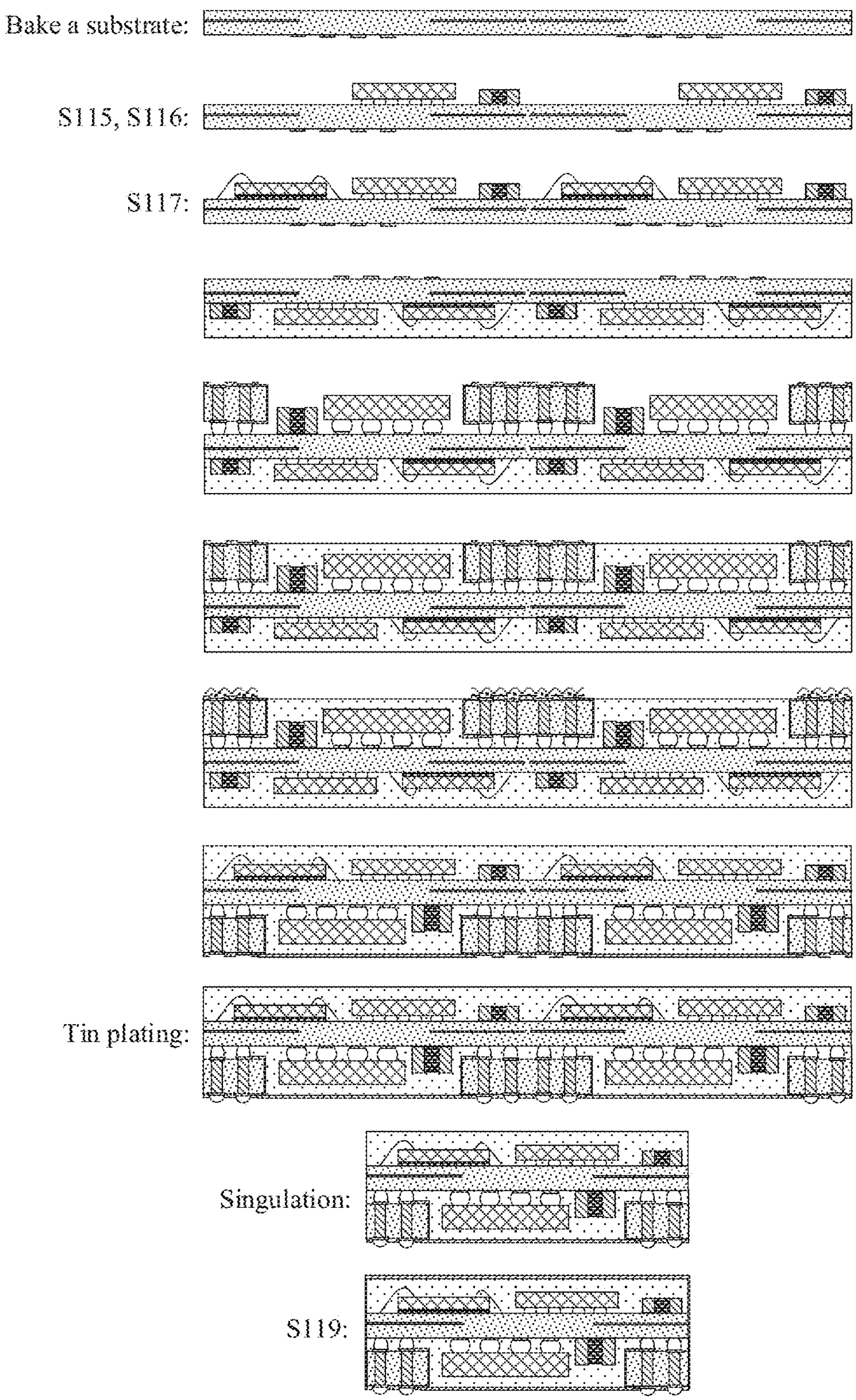
FIG. 22 is an exploded view of another chip packaging method according to an embodiment of this application.

In some implementations, for a situation in which packaging on both sides of the substrate 1 is required, referring to FIG. 21, FIG. 21 is a schematic flowchart of another chip packaging method according to an embodiment of this application. Referring to FIG. 22, FIG. 22 is an exploded view of another chip packaging method according to an embodiment of this application. Specifically, the packaging method may include the following steps.

S116: Printing solder paste on an other side surface of the substrate 1.

During specific implementation, the substrate 1 may be pre-baked before solder paste printing.

During soldering and packaging of the device, the solder can play the role of flux.

S117: Soldering or bonding a second crystal device 9 to an other surface of the substrate 1.

It may be seen from FIG. 12 that the second crystal device 9 may be arranged on the surface of the substrate 1 by soldering, and may be directly soldered to the substrate 1, for example, a second crystal device 9*a*. The second crystal device may also be soldered to the substrate 1 by BGA solder balls, for example, a second crystal device 9*b*. The second crystal device 9 may further be arranged on the surface of the substrate 1 by bonding, for example, a second crystal device 9*c*. At this point, wire bonding (bonding) may be performed between the second crystal device 9*c* and the substrate 1, so that the second crystal device 9*c* is electrically connected to the substrate 1.

During specific implementation, the second crystal device 9*a* and the second crystal device 9*b* that are to be soldered may be soldered to the substrate 1 by using a reflow soldering process, and then plasma cleaning is performed to remove the solder paste remaining on the surface of the substrate 1. Adhesive is dispensed at the position where the second crystal device 9*c* is packaged, then the third crystal device 9*c* is bonded to the substrate 1, and then the wire bonding (bonding) is performed.

S118: Coating a molding compound on a surface of the second crystal device 9 to form a second plastic packaging layer 10.

During specific implementation, before the manufacturing of the second plastic packaging layer 10, plasma cleaning should further be performed to remove residual glue and the like on the surface of the substrate 1.

The second plastic packaging layer 10 needs to be cured for a period of time, after the curing, the second plastic packaging layer 10 can be wrapped around the second crystal device 9, so as to achieve the functions of insulation, heat dissipation, and dust prevention. In addition, the second crystal device 9 can be prevented from being displaced or damaged when subjected to an external force. The second plastic packaging laver 10 may be formed of a molding compound and shaped by a molding jig. The molding compound may include epoxy resin, organic silicone resin materials, and the like.

In some implementations, during the double-sided packaging, after the manufacturing of the second crystal device 9 and the second plastic packaging layer 10 is completed, a first crystal device 2, a first part 41, a second part 42, and a first shielding metal 6 may be manufactured. For specific manufacturing operations, reference may be made to S102, S103, S104 S105, and S106.

Still refer to FIG. 21. Before the adapter board 3 is soldered, the second shielding metal 7 is manufactured on the adapter board 3, and a soldering-resist layer 5 should further be manufactured on the surface of the second ground pad 33.

S119: Covering a surface of the second plastic packaging layer 10 and the side surface of the substrate 1 with a metal after the second plastic packaging layer 10 is cured, to form a third shielding metal 11.

During specific implementation, the covering method of the third shielding metal 11 may adopt the process of spraying or sputtering.

Before the manufacturing of the third shielding metal 11, an operation of tinning may further be performed on the second ground pad 33 of the adapter board 3.

S120: Manufacturing a ground metal layer 12 inside the substrate 1, where the ground metal layer 12 extends from the inside of the substrate 1 to the side surface of the substrate 1 and is connected to the third shielding metal 11.

During specific implementation, this step may be performed simultaneously when the substrate 1 is manufactured.

In some implementations, the third shielding metal 11 may further cover a side surface of the second part 42 facing away from the first crystal device 9 and the side surface of the adapter board 1 facing away from the first crystal device 9. Specific packaging steps are as follows.

S121: Covering the side surface of the second part 42 facing away from the first crystal device 9 and the side surface of the adapter board 3 facing away from the first crystal device 2 with a metal, to form the third shielding metal 11.

In some implementations, during the packaging of the electronic device by using the chip packaging method provided in the embodiment of this application, two or more chips may be packaged at one time to form a package of two or more chips. On the premise of ensuring the performance and quality of the chip, the package of two or more chips is singulated into single chips. For example, in the decomposition step shown in FIG. 22, the singulation operation may be performed before S119.

It should be understood that FIG. 22 only shows a situation where the first shielding metal 6 is grounded by the first shielding segment 71, the second shielding segment 72, and the third shielding segment 73, and a situation where the first shielding metal 6 is grounded by other devices is not described in detail herein again.

In some embodiments, the electronic device provided in the embodiment of this application may be some miniaturized devices, such as headsets, smart bracelets, smart watches, and the like.

According to the technical solution provided in the embodiment of this application, shielding between components can be realized without needing to expand a layout space, and the leakage of electromagnetic signals can also be prevented. In addition, when the chip needs to be packaged on both sides, the technical solution provided in this application can also realize the shielding of electromagnetic signals. During realizing of the shielding property, there is no need to add other components, the process is simple, and the integration is high.

In the foregoing specific implementations, the objectives, technical solutions, and benefits of the embodiments of this application are further described in detail. It should be understood that the foregoing descriptions are merely specific implementations of the embodiments of this application, but are not intended to limit the protection scope of the embodiments of this application. Any modification, equivalent replacement, or improvement made based on the technical solutions of the embodiments of this application shall fall within the protection scope of the embodiments of this application.

What is claimed is:

1. A true wireless stereo (TWS) headset, comprising:

a housing;

a substrate arranged in the housing;

a first crystal device and an adapter board arranged in parallel on a side surface of the substrate, wherein the adapter board comprises a first ground pad, a solder ball, and multiple interconnect vias, wherein one end of each of the interconnect vias is connected to the first ground pad, wherein another end of each of the interconnect vias extends through a surface of the adapter board facing away from the substrate, wherein the first ground pad is arranged on a surface of the adapter board facing the substrate, wherein the solder ball is formed between the first ground pad and the substrate, and wherein the adapter board is electrically connected to the substrate by the first ground pad and the solder ball so that the adapter board is grounded;

a first plastic packaging layer comprising a first part that is arranged on a surface of the first crystal device, and comprising a second part that is arranged between the adapter board and the substrate, wherein the first part and the second part are integrally formed;

a first shielding metal that covers a surface of the first part, wherein a first end of the first shielding metal extends from the surface of the first part to the surface of the adapter board facing away from the substrate, wherein the first end of the first shielding metal covers a portion of the adapter board that is less than all of the adapter board, and wherein the first end of the first shielding metal is electrically connected to the first ground pad through a portion of the interconnection vias connected thereto; and a third ground pad arranged at a position where a second end of the first shielding metal comes into contact with the substrate, wherein the second end of the first shielding metal is connected to the third ground pad, and wherein the first shielding metal is grounded.

2. The TWS headset of claim 1, wherein the adapter board further comprises a second ground pad, wherein the second ground pad is arranged on a surface of the adapter board facing away from the substrate, wherein the portion of the interconnect vias are connected to the first ground pad and the second ground pad at respective first and second ends, and wherein the first shielding metal extends from the surface of the first part to the surface of the adapter board facing away from the substrate and is connected to the second ground pad, the portion of the interconnect vias, and the first ground pad.

3. The TWS headset of claim 1, further comprising a second shielding metal, comprising a first shielding segment and a second shielding segment, wherein the first shielding segment is arranged on a side surface of the adapter board facing the first crystal device, and an end of the first shielding segment away from the substrate is connected to the first shielding metal, and wherein the second shielding segment is arranged on the surface of the adapter board facing the substrate, one end of the second shielding segment is connected to the first shielding segment, and another end of the second shielding segment is connected to the first ground pad.

4. The TWS headset of claim 3, wherein the second shielding metal further comprises a third shielding segment, and wherein the third shielding segment is arranged on the surface of the adapter board facing away from the substrate, one end of the third shielding segment is connected to the first shielding segment, another end of the third shielding segment extends toward the second ground pad by a certain distance, and the third shielding segment is connected to the first shielding metal.

5. The TWS headset of claim 1, wherein the adapter board is distributed on an edge of the substrate.

6. The TWS headset of claim 3, further comprising:

a second crystal device arranged on another surface of the substrate;

a second plastic packaging layer arranged on a surface of the second crystal device;

a third shielding metal covering a surface of the second plastic packaging layer and the side surface of the substrate; and a ground metal layer located inside the substrate, extending from inside of the substrate to the side surface of the substrate, and connected to the third shielding metal.

7. The TWS headset of claim 6, wherein the third shielding metal further covers a side surface of the second part facing away from the first crystal device, and further covers a side surface of the adapter board facing away from the first crystal device.

8. The TWS headset of claim 1, wherein the first crystal device comprises a NOR flash memory, a metal-oxide-semiconductor (MOS) transistor, a system-on-chip (SoC) chip, a decoding circuit, a charging chip, a resistor, inductor, capacitor (RLC) device, a crystal, a Bluetooth chip, a radio frequency chip, a Wi-Fi chip, a near-field communications (NFC) chip, a sensor, or combinations thereof.

9. The TWS headset of claim 6, wherein the second crystal device comprises a NOR flash memory, a metal oxide-semiconductor (MOS) transistor, a system-on-chip (SoC) chip, a decoding circuit, a charging chip, a resistor, inductor, capacitor (RLC) device, a crystal, a Bluetooth chip, a radio frequency chip, a Wi-Fi chip, a near-field communications (NFC) chip, a sensor, or combinations thereof.

10. The TWS headset of claim 6, wherein the first shielding metal, the second shielding metal, and the third shielding metal are formed by spraying or sputtering.

11. The TWS headset of claim 1, wherein the first shielding metal is coupled to fewer than all interconnect vias of the adapter board.

* * * * *